(12) United States Patent
Maharyta et al.

(10) Patent No.: US 8,536,902 B1
(45) Date of Patent: Sep. 17, 2013

(54) CAPACITANCE TO FREQUENCY CONVERTER

(75) Inventors: Andriy Maharyta, Lviv (UA); Viktor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 47 days.

(21) Appl. No.: 13/301,764

(22) Filed: Nov. 21, 2011

Related U.S. Application Data

(63) Continuation of application No. 12/166,228, filed on Jul. 1, 2008, now Pat. No. 8,169,238.

(60) Provisional application No. 60/947,871, filed on Jul. 3, 2007.

(51) Int. Cl.
*H03C 3/00* (2006.01)

(52) U.S. Cl.
USPC .......................... 327/101; 324/658; 327/336

(58) Field of Classification Search
USPC ................ 327/101, 336, 337; 331/1 A, 1 R, 331/8, 16, 17, 108 R; 324/658
See application file for complete search history.

(56) References Cited

U.S. PATENT DOCUMENTS

| | | | |
|---|---|---|---|
| 3,660,801 A | 5/1972 | Paulfus | |
| 3,921,167 A | 11/1975 | Fox | |
| 3,979,745 A | 9/1976 | Bishop | |
| 4,039,940 A | 8/1977 | Butler et al. | |
| 4,090,092 A | 5/1978 | Serrano | |
| 4,103,252 A | 7/1978 | Bobick | |
| 4,113,378 A | 9/1978 | Wirtz | |
| 4,145,748 A | 3/1979 | Eichelberger et al. | |
| 4,193,063 A | 3/1980 | Hitt et al. | |
| 4,238,711 A | 12/1980 | Wallot | |
| 4,264,903 A | 4/1981 | Bigelow | |
| 4,266,144 A | 5/1981 | Bristol | |
| 4,283,713 A * | 8/1981 | Philipp | 341/142 |
| 4,292,604 A | 9/1981 | Embree et al. | |
| 4,293,734 A * | 10/1981 | Pepper, Jr. | 178/18.01 |

(Continued)

FOREIGN PATENT DOCUMENTS

| | | |
|---|---|---|
| EP | 0574213 A | 12/1993 |
| GB | 05000604 B2 | 2/2005 |

(Continued)

OTHER PUBLICATIONS

USPTO Advisory Action for U.S. Appl. No. 11/477,179 dated Jun. 7, 2010; 3 pages.

(Continued)

*Primary Examiner* — Lincoln Donovan
*Assistant Examiner* — Diana J Cheng

(57) ABSTRACT

A capacitance to frequency converter includes a switching capacitor circuit, a charge dissipation circuit, a comparator, and a signal generator. The switching capacitor circuit charges a sensing capacitor and transfers charge from the sensing capacitor to a circuit node of the charge dissipation circuit. The comparator is coupled to the charge dissipation circuit to compare a potential at the circuit node to a reference voltage. The signal generator is coupled to an output of the comparator and to the charge dissipation circuit. The signal generator is responsive to the output of the comparator to generate a signal fed back to control the charge dissipation circuit. A frequency of the signal is proportional to a capacitance of the sensing capacitor.

20 Claims, 6 Drawing Sheets

(56) References Cited

U.S. PATENT DOCUMENTS

| | | | | |
|---|---|---|---|---|
| 4,305,135 | A | 12/1981 | Dahl et al. | |
| 4,438,404 | A * | 3/1984 | Philipp | 327/263 |
| 4,475,151 | A * | 10/1984 | Philipp | 363/63 |
| 4,497,575 | A * | 2/1985 | Philipp | 356/73.1 |
| 4,558,274 | A | 12/1985 | Carusillo | |
| 4,586,260 | A | 5/1986 | Baxter et al. | |
| 4,614,937 | A | 9/1986 | Poujois | |
| 4,728,932 | A | 3/1988 | Atherton | |
| 4,736,097 | A * | 4/1988 | Philipp | 250/221 |
| 4,736,191 | A * | 4/1988 | Matzke et al. | 341/20 |
| 4,742,331 | A * | 5/1988 | Barrow et al. | 341/152 |
| 4,772,983 | A * | 9/1988 | Kerber et al. | 361/283.1 |
| 4,773,024 | A * | 9/1988 | Faggin et al. | 706/20 |
| 4,802,103 | A * | 1/1989 | Faggin et al. | 706/38 |
| 4,825,147 | A | 4/1989 | Cook et al. | |
| 4,831,325 | A | 5/1989 | Watson, Jr. | |
| 4,876,534 | A * | 10/1989 | Mead et al. | 340/14.67 |
| 4,878,013 | A | 10/1989 | Andermo | |
| 4,879,461 | A * | 11/1989 | Philipp | 250/221 |
| 4,879,505 | A * | 11/1989 | Barrow et al. | 323/312 |
| 4,879,508 | A | 11/1989 | Andermo | |
| 4,920,399 | A * | 4/1990 | Hall | 257/351 |
| 4,935,702 | A * | 6/1990 | Mead et al. | 365/185.32 |
| 4,940,980 | A * | 7/1990 | Tice | 341/159 |
| 4,953,928 | A * | 9/1990 | Anderson et al. | 257/321 |
| 4,962,342 | A * | 10/1990 | Mead et al. | 706/33 |
| 4,977,480 | A * | 12/1990 | Nishihara | 361/283.4 |
| 5,008,497 | A | 4/1991 | Asher | |
| 5,049,758 | A * | 9/1991 | Mead et al. | 365/185.21 |
| 5,055,827 | A * | 10/1991 | Philipp | 340/568.4 |
| 5,059,920 | A * | 10/1991 | Anderson et al. | 330/253 |
| 5,068,622 | A * | 11/1991 | Mead et al. | 330/253 |
| 5,073,759 | A * | 12/1991 | Mead et al. | 330/288 |
| 5,083,044 | A * | 1/1992 | Mead et al. | 327/94 |
| 5,095,284 | A * | 3/1992 | Mead | 330/253 |
| 5,097,305 | A * | 3/1992 | Mead et al. | 257/292 |
| 5,107,149 | A * | 4/1992 | Platt et al. | 327/357 |
| 5,107,501 | A | 4/1992 | Zorian | |
| 5,109,261 | A * | 4/1992 | Mead et al. | 257/369 |
| 5,119,038 | A * | 6/1992 | Anderson et al. | 330/2 |
| 5,120,996 | A * | 6/1992 | Mead et al. | 327/94 |
| 5,122,800 | A * | 6/1992 | Philipp | 341/156 |
| 5,126,685 | A * | 6/1992 | Platt et al. | 330/85 |
| 5,146,106 | A * | 9/1992 | Anderson et al. | 327/50 |
| 5,160,899 | A * | 11/1992 | Anderson et al. | 330/288 |
| 5,165,054 | A * | 11/1992 | Platt et al. | 330/277 |
| 5,166,562 | A * | 11/1992 | Allen et al. | 327/566 |
| 5,204,549 | A * | 4/1993 | Platt et al. | 706/33 |
| 5,214,388 | A | 5/1993 | Vranish et al. | |
| 5,237,879 | A | 8/1993 | Speeter | |
| 5,243,554 | A * | 9/1993 | Allen et al. | 365/185.03 |
| 5,248,873 | A * | 9/1993 | Allen et al. | 250/208.1 |
| 5,260,592 | A * | 11/1993 | Mead et al. | 257/291 |
| 5,270,963 | A * | 12/1993 | Allen et al. | 708/801 |
| 5,276,407 | A * | 1/1994 | Mead et al. | 330/308 |
| 5,281,862 | A * | 1/1994 | Ma | 327/108 |
| 5,289,023 | A * | 2/1994 | Mead | 257/291 |
| 5,294,889 | A * | 3/1994 | Heep et al. | 324/678 |
| 5,303,329 | A * | 4/1994 | Mead et al. | 706/33 |
| 5,305,017 | A * | 4/1994 | Gerpheide | 345/174 |
| 5,323,158 | A | 6/1994 | Ferguson, Jr. | |
| 5,324,958 | A * | 6/1994 | Mead et al. | 257/291 |
| 5,331,215 | A * | 7/1994 | Allen et al. | 706/33 |
| 5,336,936 | A * | 8/1994 | Allen et al. | 365/185.03 |
| 5,339,213 | A * | 8/1994 | O'Callaghan | 361/679.55 |
| 5,349,303 | A * | 9/1994 | Gerpheide | 330/257 |
| 5,373,245 | A | 12/1994 | Vranish | |
| 5,374,787 | A * | 12/1994 | Miller et al. | 178/18.06 |
| 5,381,515 | A * | 1/1995 | Platt et al. | 706/33 |
| 5,384,467 | A * | 1/1995 | Plimon et al. | 250/554 |
| 5,386,219 | A | 1/1995 | Greanias et al. | |
| 5,408,194 | A * | 4/1995 | Steinbach et al. | 327/62 |
| 5,412,387 | A * | 5/1995 | Vincelette et al. | 341/150 |
| 5,424,756 | A | 6/1995 | Ho et al. | |
| 5,461,321 | A | 10/1995 | Sanders et al. | |
| 5,479,103 | A | 12/1995 | Kernahan et al. | |
| 5,488,204 | A * | 1/1996 | Mead et al. | 178/18.06 |
| 5,495,077 | A * | 2/1996 | Miller et al. | 178/18.06 |
| 5,518,078 | A | 5/1996 | Tsujioka et al. | |
| 5,525,980 | A | 6/1996 | Jahier et al. | |
| 5,541,580 | A | 7/1996 | Gerston et al. | |
| 5,541,878 | A * | 7/1996 | LeMoncheck et al. | 365/185.03 |
| 5,543,588 | A * | 8/1996 | Bisset et al. | 178/18.06 |
| 5,543,590 | A * | 8/1996 | Gillespie et al. | 178/18.06 |
| 5,543,591 | A * | 8/1996 | Gillespie et al. | 178/18.03 |
| 5,555,907 | A * | 9/1996 | Philipp | 137/312 |
| 5,565,658 | A * | 10/1996 | Gerpheide et al. | 178/18.02 |
| 5,566,702 | A * | 10/1996 | Philipp | 137/1 |
| 5,572,205 | A * | 11/1996 | Caldwell et al. | 341/33 |
| 5,589,856 | A | 12/1996 | Stein et al. | |
| 5,629,891 | A * | 5/1997 | LeMoncheck et al. | 365/185.03 |
| 5,648,642 | A * | 7/1997 | Miller et al. | 178/18.06 |
| 5,670,915 | A * | 9/1997 | Cooper et al. | 331/111 |
| 5,672,959 | A * | 9/1997 | Der | 323/273 |
| 5,680,070 | A | 10/1997 | Anderson et al. | |
| 5,682,032 | A * | 10/1997 | Philipp | 235/422 |
| 5,684,487 | A * | 11/1997 | Timko | 341/172 |
| 5,694,063 | A * | 12/1997 | Burlison et al. | 327/50 |
| 5,730,165 | A * | 3/1998 | Philipp | 137/1 |
| 5,748,185 | A | 5/1998 | Stephan et al. | |
| 5,757,368 | A * | 5/1998 | Gerpheide et al. | 715/769 |
| 5,760,852 | A | 6/1998 | Wu et al. | |
| 5,763,909 | A * | 6/1998 | Mead et al. | 257/291 |
| 5,763,924 | A * | 6/1998 | Lum et al. | 257/386 |
| 5,767,457 | A * | 6/1998 | Gerpheide et al. | 178/18.03 |
| 5,796,183 | A * | 8/1998 | Hourmand | 307/116 |
| 5,801,340 | A | 9/1998 | Peter | |
| 5,812,698 | A * | 9/1998 | Platt et al. | 382/186 |
| 5,841,078 | A * | 11/1998 | Miller et al. | 178/18.06 |
| 5,844,265 | A * | 12/1998 | Mead et al. | 257/291 |
| 5,854,625 | A * | 12/1998 | Frisch et al. | 345/173 |
| 5,861,583 | A * | 1/1999 | Schediwy et al. | 178/18.06 |
| 5,861,875 | A * | 1/1999 | Gerpheide | 345/174 |
| 5,864,242 | A * | 1/1999 | Allen et al. | 326/44 |
| 5,864,392 | A * | 1/1999 | Winklhofer et al. | 356/28 |
| 5,880,411 | A * | 3/1999 | Gillespie et al. | 178/18.01 |
| 5,889,236 | A * | 3/1999 | Gillespie et al. | 178/18.01 |
| 5,905,489 | A | 5/1999 | Takahama et al. | |
| 5,914,465 | A * | 6/1999 | Allen et al. | 178/18.06 |
| 5,914,708 | A * | 6/1999 | LaGrange et al. | 345/179 |
| 5,920,309 | A | 7/1999 | Bisset et al. | |
| 5,920,310 | A * | 7/1999 | Faggin et al. | 345/173 |
| 5,926,566 | A * | 7/1999 | Wang et al. | 382/185 |
| 5,942,733 | A * | 8/1999 | Allen et al. | 178/18.01 |
| 5,943,052 | A * | 8/1999 | Allen et al. | 715/787 |
| 5,949,264 | A | 9/1999 | Lo | |
| 5,969,513 | A * | 10/1999 | Clark | 323/282 |
| 6,023,422 | A * | 2/2000 | Allen et al. | 365/185.03 |
| 6,028,271 | A * | 2/2000 | Gillespie et al. | 178/18.01 |
| 6,028,959 | A * | 2/2000 | Wang et al. | 382/185 |
| 6,037,929 | A | 3/2000 | Ogura et al. | |
| 6,037,930 | A | 3/2000 | Wolfe et al. | |
| 6,060,957 | A | 5/2000 | Kodrnja et al. | |
| 6,067,019 | A | 5/2000 | Scott | |
| 6,097,432 | A * | 8/2000 | Mead et al. | 348/302 |
| 6,140,853 | A | 10/2000 | Lo | |
| 6,145,850 | A | 11/2000 | Rehm | |
| 6,148,104 | A * | 11/2000 | Wang et al. | 382/185 |
| 6,184,871 | B1 | 2/2001 | Teres et al. | |
| 6,185,450 | B1 * | 2/2001 | Seguine et al. | 600/509 |
| 6,188,228 | B1 * | 2/2001 | Philipp | 324/658 |
| 6,188,391 | B1 * | 2/2001 | Seely et al. | 345/173 |
| 6,191,723 | B1 | 2/2001 | Lewis | |
| 6,222,528 | B1 * | 4/2001 | Gerpheide et al. | 345/173 |
| 6,239,389 | B1 * | 5/2001 | Allen et al. | 178/18.01 |
| 6,249,447 | B1 * | 6/2001 | Boylan et al. | 363/97 |
| 6,262,717 | B1 * | 7/2001 | Donohue et al. | 345/173 |
| 6,271,719 | B1 * | 8/2001 | Sevastopoulos | 327/552 |
| 6,271,720 | B1 * | 8/2001 | Sevastopoulos | 327/556 |
| 6,271,835 | B1 | 8/2001 | Hoeksma | |
| 6,278,283 | B1 * | 8/2001 | Tsugai | 324/678 |
| 6,280,391 | B1 * | 8/2001 | Olson et al. | 600/509 |
| 6,288,707 | B1 * | 9/2001 | Philipp | 345/168 |
| 6,295,052 | B1 | 9/2001 | Kato et al. | |

| | | | |
|---|---|---|---|
| 6,304,014 B1 * | 10/2001 | England et al. .............. 310/68 B |
| 6,320,184 B1 * | 11/2001 | Winklhofer et al. ...... 250/227.11 |
| 6,323,846 B1 * | 11/2001 | Westerman et al. ............ 345/173 |
| 6,326,859 B1 * | 12/2001 | Goldman et al. .............. 331/143 |
| 6,342,817 B1 * | 1/2002 | Crofts et al. .................. 331/1 R |
| 6,344,773 B1 * | 2/2002 | Sevastopoulos et al. ...... 327/558 |
| 6,353,200 B1 | 3/2002 | Schwankhart |
| 6,366,099 B1 | 4/2002 | Reddi |
| 6,377,009 B1 * | 4/2002 | Philipp .......................... 318/468 |
| 6,377,129 B1 | 4/2002 | Rhee et al. |
| 6,380,929 B1 * | 4/2002 | Platt .............................. 345/173 |
| 6,380,931 B1 * | 4/2002 | Gillespie et al. .............. 345/173 |
| 6,400,217 B1 * | 6/2002 | Bhandari ....................... 327/554 |
| 6,414,671 B1 * | 7/2002 | Gillespie et al. .............. 345/157 |
| 6,424,338 B1 | 7/2002 | Anderson |
| 6,430,305 B1 * | 8/2002 | Decker .......................... 382/116 |
| 6,441,073 B1 * | 8/2002 | Tanaka et al. ................. 524/414 |
| 6,441,682 B1 * | 8/2002 | Vinn et al. ..................... 327/552 |
| 6,445,257 B1 * | 9/2002 | Cox et al. .................. 331/117 R |
| 6,448,911 B1 | 9/2002 | Somayajula |
| 6,452,514 B1 * | 9/2002 | Philipp ............................ 341/33 |
| 6,457,355 B1 * | 10/2002 | Philipp ........................ 73/304 C |
| 6,459,321 B1 * | 10/2002 | Belch ............................ 327/323 |
| 6,466,036 B1 * | 10/2002 | Philipp .......................... 324/678 |
| 6,473,069 B1 * | 10/2002 | Gerpheide ..................... 345/157 |
| 6,489,899 B1 * | 12/2002 | Ely et al. ......................... 341/20 |
| 6,490,203 B1 | 12/2002 | Tang |
| 6,498,720 B2 * | 12/2002 | Glad ......................... 361/679.11 |
| 6,499,359 B1 * | 12/2002 | Washeleski et al. ...... 73/862.473 |
| 6,522,083 B1 * | 2/2003 | Roach ........................... 315/224 |
| 6,522,128 B1 * | 2/2003 | Ely et al. .................. 324/207.17 |
| 6,522,187 B1 * | 2/2003 | Sousa ............................ 327/391 |
| 6,523,416 B2 * | 2/2003 | Takagi et al. ................... 73/760 |
| 6,529,015 B2 * | 3/2003 | Nonoyama et al. ........... 324/678 |
| 6,534,970 B1 * | 3/2003 | Ely et al. .................. 324/207.17 |
| 6,535,200 B2 * | 3/2003 | Philipp .......................... 345/168 |
| 6,570,557 B1 * | 5/2003 | Westerman et al. ............ 345/173 |
| 6,574,095 B2 | 6/2003 | Suzuki |
| 6,577,140 B1 | 6/2003 | Wenman |
| 6,583,632 B2 | 6/2003 | Von Basse et al. |
| 6,587,093 B1 * | 7/2003 | Shaw et al. .................... 345/163 |
| 6,597,347 B1 | 7/2003 | Yasutake |
| 6,610,936 B2 * | 8/2003 | Gillespie et al. ............ 178/18.01 |
| 6,614,313 B2 * | 9/2003 | Crofts et al. ................... 331/1 R |
| 6,624,640 B2 * | 9/2003 | Lund et al. ..................... 324/678 |
| 6,639,586 B2 * | 10/2003 | Gerpheide ..................... 345/173 |
| 6,642,857 B1 * | 11/2003 | Schediwy et al. .............. 341/20 |
| 6,649,924 B1 * | 11/2003 | Philipp et al. ................. 250/221 |
| 6,667,740 B2 * | 12/2003 | Ely et al. ....................... 345/179 |
| 6,673,308 B2 * | 1/2004 | Hino et al. ..................... 420/448 |
| 6,677,758 B2 | 1/2004 | Maki et al. |
| 6,677,932 B1 * | 1/2004 | Westerman .................... 345/173 |
| 6,680,731 B2 * | 1/2004 | Gerpheide et al. ............ 345/173 |
| 6,683,462 B2 * | 1/2004 | Shimizu ........................ 324/658 |
| 6,690,066 B1 | 2/2004 | Lin et al. |
| 6,704,005 B2 * | 3/2004 | Kato et al. ..................... 345/173 |
| 6,705,511 B1 * | 3/2004 | Dames et al. ............... 228/180.5 |
| 6,714,817 B2 * | 3/2004 | Daynes et al. ..................... 607/5 |
| 6,720,777 B2 | 4/2004 | Wang |
| 6,730,863 B1 * | 5/2004 | Gerpheide et al. ......... 178/18.02 |
| 6,731,121 B1 * | 5/2004 | Hsu et al. ...................... 324/678 |
| 6,744,258 B2 * | 6/2004 | Ishio et al. ..................... 324/548 |
| 6,750,852 B2 * | 6/2004 | Gillespie et al. .............. 345/173 |
| 6,768,420 B2 | 7/2004 | McCarthy et al. |
| 6,774,644 B2 | 8/2004 | Eberlein |
| 6,781,577 B2 | 8/2004 | Shigetaka |
| 6,788,221 B1 * | 9/2004 | Ely et al. ......................... 341/20 |
| 6,788,521 B2 | 9/2004 | Nishi |
| 6,798,218 B2 * | 9/2004 | Kasperkovitz ................ 324/658 |
| 6,806,693 B1 | 10/2004 | Bron |
| 6,809,275 B1 * | 10/2004 | Cheng et al. .................... 200/14 |
| 6,810,442 B1 | 10/2004 | Lin et al. |
| 6,825,673 B1 | 11/2004 | Yamaoka |
| 6,825,890 B2 | 11/2004 | Matsufusa |
| 6,829,727 B1 | 12/2004 | Pawloski |
| 6,838,887 B2 | 1/2005 | Denen et al. |
| 6,856,433 B2 * | 2/2005 | Hatano et al. ..................... 359/7 |
| 6,859,159 B2 | 2/2005 | Michalski |
| 6,861,961 B2 | 3/2005 | Sandbach et al. |
| 6,873,203 B1 * | 3/2005 | Latham et al. ................. 327/538 |
| 6,879,215 B1 * | 4/2005 | Roach ........................... 330/292 |
| 6,882,338 B2 | 4/2005 | Flowers |
| 6,888,536 B2 * | 5/2005 | Westerman et al. ........... 345/173 |
| 6,888,538 B2 * | 5/2005 | Ely et al. ....................... 345/173 |
| 6,891,531 B2 | 5/2005 | Lin |
| 6,893,724 B2 * | 5/2005 | Lin et al. ....................... 428/429 |
| 6,897,673 B2 | 5/2005 | Savage et al. |
| 6,903,402 B2 | 6/2005 | Miyazawa |
| 6,904,570 B2 | 6/2005 | Foote et al. |
| 6,914,547 B1 * | 7/2005 | Swaroop et al. ............... 341/144 |
| 6,933,873 B1 * | 8/2005 | Horsley et al. ................ 341/148 |
| 6,940,291 B1 | 9/2005 | Ozick |
| 6,946,853 B2 | 9/2005 | Gifford et al. |
| 6,949,811 B2 | 9/2005 | Miyazawa |
| 6,949,937 B2 * | 9/2005 | Knoedgen ..................... 324/658 |
| 6,958,594 B2 * | 10/2005 | Redl et al. ..................... 323/282 |
| 6,969,978 B2 * | 11/2005 | Dening ......................... 323/282 |
| 6,970,120 B1 | 11/2005 | Bjornsen |
| 6,970,126 B1 * | 11/2005 | O'Dowd et al. ............... 341/172 |
| 6,975,123 B1 * | 12/2005 | Malang et al. ................. 324/658 |
| 6,993,607 B2 * | 1/2006 | Philipp ............................ 710/67 |
| 6,999,009 B2 | 2/2006 | Monney |
| 7,002,557 B2 | 2/2006 | Iizuka et al. |
| 7,006,078 B2 | 2/2006 | Kim |
| 7,006,938 B2 | 2/2006 | Laraia et al. |
| 7,030,782 B2 | 4/2006 | Ely et al. |
| 7,030,860 B1 | 4/2006 | Hsu et al. |
| 7,031,886 B1 | 4/2006 | Hargreaves |
| 7,032,051 B2 * | 4/2006 | Reay et al. ..................... 710/301 |
| 7,046,230 B2 | 5/2006 | Zadesky et al. |
| 7,068,039 B2 | 6/2006 | Parker |
| 7,075,316 B2 | 7/2006 | Umeda et al. |
| 7,075,864 B2 | 7/2006 | Kakitsuka et al. |
| 7,078,916 B2 | 7/2006 | Denison |
| 7,098,675 B2 | 8/2006 | Inaba et al. |
| 7,109,978 B2 | 9/2006 | Gillespie et al. |
| 7,119,550 B2 * | 10/2006 | Kitano et al. .................. 324/658 |
| 7,129,714 B2 | 10/2006 | Baxter |
| 7,129,935 B2 | 10/2006 | Mackey |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,276 B2 | 12/2006 | Gerlach et al. |
| 7,151,528 B2 | 12/2006 | Taylor et al. |
| 7,158,056 B2 | 1/2007 | Wright et al. |
| 7,158,125 B2 | 1/2007 | Sinclair et al. |
| 7,202,655 B2 * | 4/2007 | Itoh ............................... 323/316 |
| 7,202,857 B2 | 4/2007 | Hinckley et al. |
| 7,205,777 B2 * | 4/2007 | Schulz et al. .................. 324/661 |
| 7,212,189 B2 | 5/2007 | Shaw et al |
| 7,224,591 B2 * | 5/2007 | Kaishita et al. .................. 363/60 |
| 7,225,090 B2 | 5/2007 | Coley |
| 7,233,508 B2 * | 6/2007 | Itoh ................................. 363/60 |
| 7,235,983 B2 | 6/2007 | O'Dowd et al. |
| 7,245,131 B2 * | 7/2007 | Kurachi et al. ................ 324/663 |
| 7,253,643 B1 * | 8/2007 | Seguine ........................ 324/686 |
| 7,254,775 B2 | 8/2007 | Geaghan et al. |
| 7,256,588 B2 | 8/2007 | Howard et al. |
| 7,262,609 B2 | 8/2007 | Reynolds |
| 7,271,608 B1 | 9/2007 | Vermeire et al. |
| 7,288,946 B2 * | 10/2007 | Hargreaves et al. ........... 324/678 |
| 7,288,977 B2 | 10/2007 | Stanley |
| 7,298,124 B2 | 11/2007 | Kan et al. |
| 7,301,350 B2 * | 11/2007 | Hargreaves et al. ........... 324/678 |
| 7,307,485 B1 * | 12/2007 | Snyder et al. .................. 331/150 |
| 7,312,616 B2 * | 12/2007 | Snyder .......................... 324/658 |
| 7,323,879 B2 | 1/2008 | Kuo et al. |
| 7,323,886 B2 * | 1/2008 | Lee ................................ 324/679 |
| 7,333,090 B2 | 2/2008 | Tanaka et al. |
| 7,339,580 B2 | 3/2008 | Westerman et al. |
| 7,359,816 B2 | 4/2008 | Kumar et al. |
| 7,375,535 B1 | 5/2008 | Kutz et al. |
| 7,381,031 B2 | 6/2008 | Kawaguchi et al. |
| 7,392,431 B2 | 6/2008 | Swoboda |
| 7,417,411 B2 | 8/2008 | Hoffman et al. |
| 7,417,441 B2 | 8/2008 | Reynolds |

| | | |
|---|---|---|
| 7,423,437 B2 | 9/2008 | Hargreaves et al. |
| 7,439,962 B2 | 10/2008 | Reynolds et al. |
| 7,449,895 B2 * | 11/2008 | Ely et al. .................. 324/678 |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,515,140 B2 | 4/2009 | Philipp |
| 7,521,941 B2 | 4/2009 | Ely et al. |
| RE40,867 E | 8/2009 | Binstead |
| 7,598,752 B2 | 10/2009 | Li |
| 7,598,822 B2 | 10/2009 | Rajagopal et al. |
| 7,667,468 B1 * | 2/2010 | Anderson .................. 324/676 |
| 7,683,641 B2 | 3/2010 | Hargreaves et al. |
| 7,804,307 B1 | 9/2010 | Bokma et al. |
| 7,812,829 B2 | 10/2010 | Gillespie et al. |
| 7,821,274 B2 | 10/2010 | Philipp et al. |
| 7,911,456 B2 | 3/2011 | Gillespie et al. |
| 7,932,897 B2 | 4/2011 | Elias et al. |
| 8,040,142 B1 | 10/2011 | Bokma et al. |
| 8,068,097 B2 | 11/2011 | Guanghai |
| 8,082,566 B2 | 12/2011 | Stallings |
| 8,089,288 B1 | 1/2012 | Maharita |
| 8,089,289 B1 | 1/2012 | Kremin et al. |
| 8,093,914 B2 | 1/2012 | Maharyta |
| 8,169,238 B1 | 5/2012 | Maharyta et al. |
| 2001/0012667 A1 | 8/2001 | Ma et al. |
| 2002/0063688 A1 * | 5/2002 | Shaw et al. .................. 345/163 |
| 2002/0067348 A1 | 6/2002 | Masters et al. |
| 2002/0191029 A1 * | 12/2002 | Gillespie et al. .......... 345/810 |
| 2003/0014239 A1 | 1/2003 | Ichbiah et al. |
| 2003/0025679 A1 * | 2/2003 | Taylor et al. .................. 345/175 |
| 2003/0062889 A1 * | 4/2003 | Ely et al. .................. 324/207.17 |
| 2003/0063428 A1 * | 4/2003 | Nishi .......................... 361/301.4 |
| 2003/0080755 A1 * | 5/2003 | Kobayashi .................. 324/658 |
| 2003/0091220 A1 | 5/2003 | Sato et al. |
| 2003/0098858 A1 | 5/2003 | Perski et al. |
| 2003/0112021 A1 | 6/2003 | Palata et al. |
| 2003/0156098 A1 * | 8/2003 | Shaw et al. .................. 345/163 |
| 2003/0160808 A1 * | 8/2003 | Foote et al. .................. 345/700 |
| 2003/0178675 A1 | 9/2003 | Nishizaka et al. |
| 2003/0183864 A1 * | 10/2003 | Miyazawa .................. 257/307 |
| 2003/0183884 A1 * | 10/2003 | Miyazawa .................. 257/401 |
| 2003/0184315 A1 * | 10/2003 | Eberlein .................. 324/658 |
| 2003/0232507 A1 | 12/2003 | Chen |
| 2004/0082198 A1 | 4/2004 | Nakamura et al. |
| 2004/0169594 A1 * | 9/2004 | Ely et al. .................. 341/22 |
| 2004/0178989 A1 | 9/2004 | Shahoian et al. |
| 2004/0178997 A1 * | 9/2004 | Gillespie et al. .......... 345/173 |
| 2004/0183560 A1 | 9/2004 | Savage et al. |
| 2004/0217945 A1 | 11/2004 | Miyamoto et al. |
| 2004/0239616 A1 | 12/2004 | Collins |
| 2004/0252109 A1 * | 12/2004 | Trent et al. .................. 345/174 |
| 2004/0263864 A1 * | 12/2004 | Lukacs et al. .............. 356/612 |
| 2005/0021269 A1 * | 1/2005 | Ely et al. .................. 702/95 |
| 2005/0024341 A1 * | 2/2005 | Gillespie et al. .......... 345/173 |
| 2005/0031175 A1 | 2/2005 | Hara et al. |
| 2005/0062732 A1 | 3/2005 | Sinclair et al. |
| 2005/0073302 A1 * | 4/2005 | Hibbs et al. .................. 324/247 |
| 2005/0073322 A1 * | 4/2005 | Hibbs et al. .................. 324/658 |
| 2005/0083110 A1 | 4/2005 | Latham, II et al. |
| 2005/0159126 A1 | 7/2005 | Wang |
| 2005/0179668 A1 | 8/2005 | Edwards |
| 2005/0270273 A1 | 12/2005 | Marten |
| 2005/0275382 A1 | 12/2005 | Stessman et al. |
| 2005/0283330 A1 | 12/2005 | Laraia et al. |
| 2006/0022660 A1 | 2/2006 | Itoh |
| 2006/0026535 A1 | 2/2006 | Hotelling et al. |
| 2006/0032680 A1 * | 2/2006 | Elias et al. .................. 178/18.06 |
| 2006/0033508 A1 | 2/2006 | Lee |
| 2006/0033724 A1 | 2/2006 | Chaudhri et al. |
| 2006/0038793 A1 | 2/2006 | Philipp |
| 2006/0049834 A1 | 3/2006 | Umeda |
| 2006/0053387 A1 | 3/2006 | Ording |
| 2006/0066582 A1 * | 3/2006 | Lyon et al. .................. 345/173 |
| 2006/0066585 A1 | 3/2006 | Lin |
| 2006/0097991 A1 * | 5/2006 | Hotelling et al. .......... 345/173 |
| 2006/0097992 A1 | 5/2006 | Gitzinger et al. |
| 2006/0113974 A1 * | 6/2006 | Kan et al. .................. 323/282 |
| 2006/0114247 A1 | 6/2006 | Brown |
| 2006/0139269 A1 | 6/2006 | Yokota et al. |
| 2006/0164142 A1 * | 7/2006 | Stanley .................. 327/172 |
| 2006/0176718 A1 | 8/2006 | Itoh |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0227117 A1 | 10/2006 | Proctor |
| 2006/0232559 A1 | 10/2006 | Chien et al. |
| 2006/0258390 A1 | 11/2006 | Cui et al. |
| 2006/0262101 A1 | 11/2006 | Layton et al. |
| 2006/0267953 A1 | 11/2006 | Peterson et al. |
| 2006/0273804 A1 * | 12/2006 | Delorme et al. .......... 324/658 |
| 2006/0290678 A1 | 12/2006 | Lii |
| 2007/0046299 A1 | 3/2007 | Hargreaves et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0132737 A1 | 6/2007 | Mulligan et al. |
| 2007/0152983 A1 | 7/2007 | McKillop et al. |
| 2007/0164756 A1 | 7/2007 | Lee |
| 2007/0173220 A1 | 7/2007 | Kim et al. |
| 2007/0176609 A1 | 8/2007 | Ely et al. |
| 2007/0176903 A1 | 8/2007 | Dahlin et al. |
| 2007/0229469 A1 | 10/2007 | Seguine |
| 2007/0236478 A1 | 10/2007 | Geaghan et al. |
| 2007/0257894 A1 | 11/2007 | Philipp |
| 2007/0263191 A1 | 11/2007 | Shibazaki |
| 2007/0268191 A1 | 11/2007 | Choo et al. |
| 2007/0268265 A1 | 11/2007 | Xiaoping |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2007/0273659 A1 | 11/2007 | Xiaoping et al. |
| 2007/0291013 A1 | 12/2007 | Won |
| 2007/0296709 A1 | 12/2007 | Guanghai |
| 2008/0007529 A1 | 1/2008 | Paun et al. |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0047764 A1 | 2/2008 | Lee et al. |
| 2008/0048997 A1 | 2/2008 | Gillespie et al. |
| 2008/0062140 A1 | 3/2008 | Hotelling et al. |
| 2008/0068100 A1 | 3/2008 | Goodnow et al. |
| 2008/0088595 A1 | 4/2008 | Liu et al. |
| 2008/0111714 A1 * | 5/2008 | Kremin .................. 341/33 |
| 2008/0116904 A1 | 5/2008 | Reynolds et al. |
| 2008/0128182 A1 | 6/2008 | Westerman et al. |
| 2008/0158178 A1 | 7/2008 | Hotelling et al. |
| 2008/0165134 A1 | 7/2008 | Krah |
| 2008/0179112 A1 | 7/2008 | Qin et al. |
| 2008/0196945 A1 | 8/2008 | Konstas |
| 2008/0266263 A1 | 10/2008 | Motaparti et al. |
| 2008/0278178 A1 | 11/2008 | Philipp |
| 2009/0002206 A1 | 1/2009 | Kremin |
| 2009/0096758 A1 | 4/2009 | Hotelling et al. |
| 2009/0153152 A1 | 6/2009 | Maharyta et al. |
| 2009/0322351 A1 | 12/2009 | Mcleod |
| 2012/0043973 A1 | 2/2012 | Kremin |

FOREIGN PATENT DOCUMENTS

| | | |
|---|---|---|
| JP | 04012528 | 1/1992 |
| JP | 05283519 B1 | 10/1993 |
| JP | 6104334 A | 4/1994 |
| JP | 6163528 A | 6/1994 |
| WO | 0002188 A | 1/2000 |

OTHER PUBLICATIONS

USPTO Advisory Action for U.S. Appl. No. 11/512,042 dated Feb. 23, 2011; 3 pages.
USPTO Advisory Action for U.S. Appl. No. 12/367,279 dated Jun. 25, 2010; 3 pages.
USPTO Advisory Action, U.S. Appl. No. 12/332,980, dated Aug. 9, 2011, 4 pages.
USPTO Final Rejection for U.S. Appl. No. 09/975,105 dated Jul. 13, 2006; 7 pages.
USPTO Final Rejection for U.S. Appl. No. 11/230,719 dated Sep. 7, 2007; 9 pages.
USPTO Final Rejection for U.S. Appl. No. 11/273,708 dated Jul. 5, 2007; 8 pages.
USPTO Final Rejection for U.S. Appl. No. 11/337,272 dated Feb. 21, 2007; 11 pages.
USPTO Final Rejection for U.S. Appl. No. 11/395,417 dated Apr. 24, 2007; 9 pages.
USPTO Final Rejection for U.S. Appl. No. 11/437,517 dated Jan. 26, 2010; 11 pages.
USPTO Final Rejection for U.S. Appl. No. 11/442,212 dated Jun. 7, 2011; 14 pages.
USPTO Final Rejection for U.S. Appl. No. 11/442,212 dated Oct. 2, 2009; 12 pages.
USPTO Final Rejection for U.S. Appl. No. 11/442,212 dated Oct. 13, 2010; 13 pages.
USPTO Final Rejection for U.S. Appl. No. 11/477,179 dated Apr. 1, 2010; 10 pages.
USPTO Final Rejection for U.S. Appl. No. 11/477,179 dated Nov. 24, 2010; 10 pages.
USPTO Final Rejection for U.S. Appl. No. 11/484,085 dated Mar. 16, 2010; 7 pages.
USPTO Final Rejection for U.S. Appl. No. 11/502,267 dated Feb. 3, 2009; 10 pages.
USPTO Final Rejection for U.S. Appl. No. 11/512,042 dated Dec. 21, 2010; 7 pages.
USPTO Final Rejection for U.S. Appl. No. 11/600,896 dated Sep. 30, 2010; 19 pages.
USPTO Final Rejection for U.S. Appl. No. 11/601,465 dated Mar. 6, 2009; 11 pages.
USPTO Final Rejection for U.S. Appl. No. 11/601,465 dated Jul. 9, 2008; 10 pages.
USPTO Final Rejection for U.S. Appl. No. 11/709,897 dated Jul. 29, 2010; 24 pages.
USPTO Final Rejection for U.S. Appl. No. 11/824,249 dated Dec. 22, 2011; 10 pages.
USPTO Final Rejection for U.S. Appl. No. 11/983,291 dated Aug. 12, 2009; 10 pages.
USPTO Final Rejection for U.S. Appl. No. 12/166,228 dated Jan. 4, 2011; 9 pages.
USPTO Final Rejection for U.S. Appl. No. 12/166,228 dated May 28, 2010; 12 pages.
USPTO Final Rejection for U.S. Appl. No. 12/239,692 dated May 9, 2011; 10 pages.
USPTO Final Rejection for U.S. Appl. No. 12/367,279 dated Apr. 1, 2010; 6 pages.
USPTO Final Rejection, U.S. Appl. No. 11/601,465, dated Mar. 6, 2009, 13 pages.
USPTO Final Rejection, U.S. Appl. No. 11/601,465, dated Jul. 9, 2008, 16 pages.
USPTO Final Rejection, U.S. Appl. No. 11/729,818, dated Jul. 2, 2009, 14 pages.
USPTO Final Rejection, U.S. Appl. No. 11/824,249, dated Dec. 22, 2011, 12 pages.
USPTO Final Rejection, U.S. Appl. No. 12/332,980, dated May 31, 2011, 12 pages.
USPTO Final Rejection, U.S. Appl. No. 12/861,812, dated Oct. 18, 2011, 16 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Non-Final Rejection for U.S. Appl. No. 11/273,708 dated Mar. 19, 2007; 16 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/395,417 dated Apr. 25, 2008; 7 pages.
USPTO Non-Final Rejection for U.S. Appl. No. 11/395,417 dated Oct. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010; 10 pages.
USPTO Non-Final Rejection for U.S. Appl. No. 11/437,517 dated Aug. 5, 2009; 9 pages.
USPTO Non-Final Rejection for U.S. Appl. No. 11/442,212 dated Feb. 25, 2011; 13 pages.
USPTO Non-Final Rejection for U.S. Appl. No. 11/442,212 dated Mar. 31, 2009;12 pages.
"CSD User Module Data Sheet," CSD v1.0, Oct. 23, 2006; 58 pages.
"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.
Andrew S. Tanebaum with contributions from James R. Goodman, "Structured Computer Organization", 1999, Prentice Hall, Fourth Edition, pp. 264-288, 359-362.
U.S. Appl. No. 12/861,812 "Capacitance Measurement Systems and Methods", filed Aug. 23, 2010, 24 pages.
U.S. Appl. No. 13/047,620 "Touch Detection Techniques for Capacitive Touch Sense Systems", filed Mar. 14, 2011, 38 pages.
U.S. Appl. No. 13/191,806 "Capacitance Measurement Systems and Methods", filed Jul. 27, 2011, 38 pages.
U.S. Appl. No. 13/342,942 "Capacitive Field Sensor With Sigma-Delta Modulator", filed Jan. 3, 2012, 41 pages.
U.S. Appl. No. 13/345,504 "Compensation Circuit for a TX-RX Capacitive Sensor", filed Jan. 6, 2012, 55 pages.
U.S. Appl. No. 13/049,798: "Capacitance to Code Converter With Sigma-Delta Modulator," Kremin, filed Mar. 16, 2011; 77 pages.
U.S. Appl. No. 11/493,350: "Technique for Increasing the Sensitivity of Capacitive Sensor Arrays," Lee et al., filed Jul. 25, 2006; 48 pages.
U.S. Appl. No. 11/600,255: "Capacitance to Code Converter With Sigma-Delta Modulator," Kremin, filed Nov. 14, 2006; 102 pages.
U.S. Appl. No. 11/601,465: "Charge Accumulation Capacitance Sensor With Linear Transfer Characteristic," Andrey Maharita, filed Nov. 16, 2006; 54 pages.
U.S. Appl. No. 11/709,897: "Preventing Unintentional Activation of a Sensor Element of a Sensing Device," Jason Konstas; filed Feb. 21, 2007; 97 pages.
U.S. Appl. No. 12/197,466: "Radical Oxidation Process for Fabricating a Nonvolatile Charge Trap Memory Device," Ramkumar et al., filed Aug. 25, 2008; 68 pages.
U.S. Appl. No. 12/380,141: "Capacitive field sensor with sigma-delta modulator," Rystun et al., filed Feb. 23, 2009; 48 pages.
U.S. Appl. No. 12/618,661: "Automatic Tuning of a Capacitive Sensing Device," Dana Olson, filed Nov. 13, 2009; 30 pages.
U.S. Appl. No. 60/220,921: "Method for Automatically Tuning a Capacitive Sensing Device," Dana Olson, filed Jun. 26, 2009; 13 pages.

Application No. PCT/US08/08055: "Noise Resistant Capacitive Sensor," filed Jun. 27, 2008; 33 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "Fan Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes srn017," Jan. 24, 2007; 3 pages.
Dave Van Ess, "Understanding Switched Capacitor Analog Blocks," Application Note AN2041, Mar. 30, 2004; 16 pages.
Dennis Seguine, "Capacitive Switch Scan," AN2233a, Application Note, CY8C21x34, Apr. 7, 2005; 6 pages.
International Search Report and Written Opinion for Application No. PCT/US08/06627 dated Aug. 26, 2008; 3 pages.
International Search Report for International Application No. PCT/US05/23468 dated Aug. 25, 2006; 2 pages.
International Search Report of the International Searching Authority for International Application No. PCT/US2008/013622 mailed Feb. 9, 2009; 2 pages.
Janusz Mlodzianowski, "A Simple Multipurpose Logic Analyzer," Dec. 1997, Circuit Cellar Ink, Issue 89, pp. 28-36.
Kremin, V. "Noise resistant capacitive sensor," U.S. Appl. No. 11/8244,249, filed Jun. 29, 2007.
Larry K. Baxter, "Capacitive Sensors, Design and Applications," IEEE Press, The Institute of Electrical and Electronics Engineers Inc., Aug. 1996, pp. 177-187; 12 pages.
Lee, Mark; "EMC Design Considerations for PSoC CapSense Applications," Cypress Semiconductor Corporation, Application Note AN2318; Sep. 16, 2005; 6 pages.
Mack, Chris, "Semiconductor Lithography—The Basic Process", Gentleman Scientist, downloaded Apr. 20, 2006, 12 pp., http://lithoguru.com/scientist/lithobasics.html.
Mark Lee, "CapSense Best Practice", Cypress Application Note AN2394, Rev., Oct. 19, 2006, pp. 1-10.
Milton Ohring, "The Materials Science of Thin Films: Deposition and Structure," 2nd Edition, Academic Press, 2002, pp. 336-337; 4 pages.
Min et al., "Offset Compensation of Capacitive Sensors for Electrostatic Microactuators," ISIE 2001, Pusan Korea, pp. 2114-2117.
Ryan Seguine et al, "Layout Guidelines for PSoC CapSense", Cypress Application Note AN2292, Revision B, Oct. 31, 2005; all pages.
Sangil Park, "Motorola Digital Signal Processors, Principles of Sigma-Delta Modulation for Analog-to-Digital Converters," Rev. 1, downloaded from <http://digitalsignallabs_com/SigmaDelta.pdf>, Mar. 1997; 64 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; Jul. 22, 2005; 13 pages.
Ted Tsui, "Migrating from CSR to CSD," Cypress Semiconductor Corporation, Application Note AN2408, Feb. 8, 2007, http://www.cypress.com.
The Authoritative Dictionary of IEEE Standards Terms, 2000, IEEE Press Publications, 7th Edition, pp. 1133-1134; 4 pages.
The Written Opinion of the International Searching Authority for International Application No. PCT/US05/23468 dated Aug. 25, 2006; 7 pages.
USPTO Advisory Action for U.S. Appl. No. 11/230,719 dated Nov. 30, 2007; 3 pages.
USPTO Advisory Action for U.S. Appl. No. 11/337,272 dated Apr. 3, 2007; 3 pages.
USPTO Advisory Action for U.S. Appl. No. 11/395,417 dated Jul. 6, 2007; 3 pages.
USPTO Advisory Action for U.S. Appl. No. 11/437,517 dated Apr. 7, 2010; 3 pages.
USPTO Advisory Action for U.S. Appl. No. 11/442,212 dated Nov. 5, 2011; 3 pages.
USPTO Advisory Action for U.S. Appl. No. 11/442,212 dated Dec. 17, 2009; 3 pages.
USPTO Notice of Allowance for U.S. Appl. No. 11/489,944 dated Apr. 9, 2007; 7 pages.
USPTO Notice of Allowance for U.S. Appl. No. 11/489,944 dated May 24, 2007; 2 pages.
USPTO Notice of Allowance for U.S. Appl. No. 11/600,255 dated Apr. 20, 2011; 7 pages.
USPTO Notice of Allowance for U.S. Appl. No. 11/600,255 dated May 30, 2012; 7 pages.
USPTO Notice of Allowance for U.S. Appl. No. 11/600,255 dated Jun. 16, 2011; 7 pages.
USPTO Notice of Allowance for U.S. Appl. No. 11/600,255 dated Jul. 27, 2010; 6 pages.
USPTO Notice of Allowance for U.S. Appl. No. 11/600,255 dated Dec. 9, 2010; 6 pages.
USPTO Notice of Allowance for U.S. Appl. No. 11/601,465 dated Jan. 11, 2010; 6 pages.
USPTO Notice of Allowance for U.S. Appl. No. 11/601,465 dated Mar. 11, 2011; 8 pages.
USPTO Notice of Allowance for U.S. Appl. No. 11/601,465 dated Apr. 22, 2010; 7 pages.
USPTO Notice of Allowance for U.S. Appl. No. 11/601,465 dated May 8, 2009; 6 pages.
USPTO Notice of Allowance for U.S. Appl. No. 11/601,465 dated Jun. 28, 2011; 8 pages.
USPTO Notice of Allowance for U.S. Appl. No. 11/601,465 dated Aug. 10, 2010; 8 pages.
USPTO Notice of Allowance for U.S. Appl. No. 11/601,465 dated Sep. 10, 2009; 7 pages.
USPTO Notice of Allowance for U.S. Appl. No. 11/601,465 dated Oct. 7, 2011; 7 pages.
USPTO Notice of Allowance for U.S. Appl. No. 11/601,465 dated Nov. 26, 2010; 7 pages.
USPTO Notice of Allowance for U.S. Appl. No. 11/700,314 dated Sep. 16, 2010; 8 pages.
USPTO Notice of Allowance for U.S. Appl. No. 11/709,866 dated Feb. 16, 2010; 7 pages.
USPTO Notice of Allowance for U.S. Appl. No. 11/729,818 dated Feb. 24, 2010; 6 pages.
USPTO Notice of Allowance for U.S. Appl. No. 11/729,818 dated Nov. 13, 2009; 7 pages.
USPTO Notice of Allowance for U.S. Appl. No. 11/823,982 dated Feb. 1, 2010; 8 pages.
USPTO Notice of Allowance for U.S. Appl. No. 11/823,982 dated Oct. 6, 2009; 12 pages.
USPTO Notice of Allowance for U.S. Appl. No. 11/880,963 dated Oct. 2, 2009; 4 pages.
USPTO Notice of Allowance for U.S. Appl. No. 11/983,291 dated Mar. 9, 2010; 7 pages.
USPTO Notice of Allowance for U.S. Appl. No. 11/983,291 dated Jun. 21, 2010; 7 pages.
USPTO Notice of Allowance for U.S. Appl. No. 11/983,291 dated Sep. 29, 2010; 7 pages.
USPTO Notice of Allowance for U.S. Appl. No. 11/983,291 dated Oct. 22, 2009; 7 pages.
USPTO Notice of Allowance for U.S. Appl. No. 12/166,228 dated Jan. 5, 2012; 8 pages.
USPTO Notice of Allowance for U.S. Appl. No. 12/166,228 dated Mar. 22, 2011; 8 pages.
USPTO Notice of Allowance for U.S. Appl. No. 12/166,228 dated Jun. 9, 2011; 8 pages.
USPTO Notice of Allowance for U.S. Appl. No. 12/166,228 dated Sep. 22, 2011; 8 pages.
USPTO Notice of Allowance for U.S. Appl. No. 12/167,100 dated Jan. 12, 2011; 8 pages.

USPTO Notice of Allowance for U.S. Appl. No. 12/167,100 dated Apr. 29, 2011; 8 pages.
USPTO Notice of Allowance for U.S. Appl. No. 12/167,100 dated Jun. 28, 2011; 8 pages.
USPTO Notice of Allowance for U.S. Appl. No. 12/167,100 dated Sep. 1, 2011; 8 pages.
USPTO Notice of Allowance for U.S. Appl. No. 12/167,100 dated Sep. 30, 2010; 7 pages.
USPTO Notice of Allowance for U.S. Appl. No. 12/239,692 dated Aug. 15, 2012; 8 pages.
USPTO Notice of Allowance for U.S. Appl. No. 12/239,692 dated Sep. 18, 2012; 8 pages.
USPTO Notice of Allowance for U.S. Appl. No. 12/332,980 dated Oct. 4, 2011; 5 pages.
USPTO Notice of Allowance for U.S. Appl. No. 12/367,279 dated Aug. 23, 2010; 7 pages.
USPTO Notice of Allowance for U.S. Appl. No. 12/395,462 dated Aug. 29, 2012; 5 pages.
USPTO Notice of Allowance for U.S. Appl. No. 12/606,147 dated Aug. 13, 2012; 7 pages.
USPTO Notice of Allowance, U.S. Appl. No. 11/600,255, dated Apr. 12, 2012, 7 pages.
USPTO Notice of Allowance, U.S. Appl. No. 11/601,465, dated Jan. 11, 2010, 18 pages.
USPTO Notice of Allowance, U.S. Appl. No. 11/601,465, dated Mar. 11, 2011, 17 pages.
USPTO Notice of Allowance, U.S. Appl. No. 11/601,465, dated Apr. 22, 2010, 41 pages.
USPTO Notice of Allowance, U.S. Appl. No. 11/601,465, dated May 8, 2009, 14 pages.
USPTO Notice of Allowance, U.S. Appl. No. 11/601,465, dated Jun. 28, 2011, 21 pages.
USPTO Notice of Allowance, U.S. Appl. No. 11/601,465, dated Aug. 10, 2010, 17 pages.
USPTO Notice of Allowance, U.S. Appl. No. 11/601,465, dated Sep. 10, 2009, 21 pages.
Chapweske, Adam; "The PS/2 Mouse Interface," PS/2 Mouse Interfacing, 2001, retrieved on May 18, 2006; 11 pages.
Cypress Semiconductor Corporation, "CY8C21x34 Data Sheet," CSR User Module, CSR V.1.0; Oct. 6, 2005; 36 pages.
Provisional Application No. 61/108,450: "Alternative Realizations of the CSX (TxRx-I) Sensing Scheme for ITO Panels," Andriy Maharyta, filed on Oct. 24, 2008; 7 pages.
USPTO Final Rejection for U.S. Appl. No. 12/395,969 dated Jul. 17, 2012; 25 pages.
USPTO Non-Final Rejection for U.S. Appl. No. 11/442,212 dated Jul. 6, 2010; 13 pages.
USPTO Non-Final Rejection for U.S. Appl. No. 11/477,179 dated Jun. 9, 2009; 13 pages.
USPTO Non-Final Rejection for U.S. Appl. No. 11/477,179 dated Jul. 20, 2010; 10 pages.
USPTO Non-Final Rejection for U.S. Appl. No. 11/477,179 dated Nov. 18, 2009; 10 pages.
USPTO Non-Final Rejection for U.S. Appl. No. 11/484,085 dated Sep. 17, 2009; 8 pages.
USPTO Non-Final Rejection for U.S. Appl. No. 11/493,350 dated Jun. 16, 2010; 8 pages.
USPTO Non-Final Rejection for U.S. Appl. No. 11/493,350 dated Nov. 9, 2010; 9 pages.
USPTO Non-Final Rejection for U.S. Appl. No. 11/502,267 dated Aug. 11, 2008; 10 pages.
USPTO Non-Final Rejection for U.S. Appl. No. 11/600,255 dated Mar. 29, 2010; 10 pages.
USPTO Non-Final Rejection for U.S. Appl. No. 11/600,896 dated May 14, 2010; 15 pages.
USPTO Non-Final Rejection for U.S. Appl. No. 11/600,896 dated Dec. 16, 2009; 13 pages.
USPTO Non-Final Rejection for U.S. Appl. No. 11/601,465 dated Oct. 2, 2008; 10 pages.
USPTO Non-Final Rejection for U.S. Appl. No. 11/601,465 dated Dec. 28, 2007; 9 pages.
USPTO Non-Final Rejection for U.S. Appl. No. 11/700,314 dated Mar. 26, 2010; 7 pages.
USPTO Non-Final Rejection for U.S. Appl. No. 11/709,897 dated Feb. 16, 2010; 21 pages.
USPTO Non-Final Rejection for U.S. Appl. No. 11/729,818 dated Dec. 17, 2008; 12 pages.
USPTO Non-Final Rejection for U.S. Appl. No. 11/823,982 dated Mar. 19, 2009; 14 pages.
USPTO Non-Final Rejection for U.S. Appl. No. 11/824,249 dated May 25, 2011; 9 pages.
USPTO Non-Final Rejection for U.S. Appl. No. 11/824,249 dated Sep. 26, 2012; 11 pages.
USPTO Non-Final Rejection for U.S. Appl. No. 11/880,963 dated Jun. 12, 2009; 10 pages.
USPTO Non-Final Rejection for U.S. Appl. No. 11/967,243 dated Sep. 17, 2009; 9 pages.
USPTO Non-Final Rejection for U.S. Appl. No. 11/983,291 dated Mar. 9, 2009; 9 pages.
USPTO Non-Final Rejection for U.S. Appl. No. 12/040,387 dated Jun. 30, 2011; 12 pages.
USPTO Non-Final Rejection for U.S. Appl. No. 12/166,228 dated Aug. 11, 2010; 8 pages.
USPTO Non-Final Rejection for U.S. Appl. No. 12/166,228 dated Dec. 30, 2009; 11 pages.
USPTO Non-Final Rejection for U.S. Appl. No. 12/199,228 dated Dec. 30, 2009; 11 pages.
USPTO Non-Final Rejection for U.S. Appl. No. 12/239,692 dated Nov. 29, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/380,141 dated Sep. 5, 2012; 6 pages.
USPTO Non-Final Rejection for U.S. Appl. No. 12/395,462 dated Aug. 23, 2011; 5 pages.
USPTO Non-Final Rejection for U.S. Appl. No. 12/606,147 dated Aug. 23, 2011; 6 pages.
USPTO Non-Final Rejection for U.S. Appl. No. 12/861,812 dated Apr. 15, 2011; 26 pages.
USPTO Non-Final Rejection, U.S. Appl. No. 11/512,042, dated Jul. 13, 2010, 14 pages.
USPTO Non-Final Rejection, U.S. Appl. No. 11/601,465, dated Oct. 2, 2008, 16 pages.
USPTO Non-Final Rejection, U.S. Appl. No. 11/601,465, dated Dec. 28, 2007, 16 pages.
USPTO Non-Final Rejection, U.S. Appl. No. 11/824,249, dated Mar. 30, 2012, 10 pages.
USPTO Non-Final Rejection, U.S. Appl. No. 12/332,980, dated Dec. 22, 2010, 20 pages.
USPTO Notice of Allowance for U.S. Appl. No. 09/975,105 dated Dec. 4, 2006; 4 pages.
USPTO Notice of Allowance for U.S. Appl. No. 09/986,338 dated Feb. 16, 2010; 4 pages.
USPTO Notice of Allowance for U.S. Appl. No. 10/888,666 dated Aug. 2, 2006; 11 pages.
USPTO Notice of Allowance for U.S. Appl. No. 11/230,719 dated Jan. 16, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 6, 2008; 7 pages.
USPTO Notice of Allowance for U.S. Appl. No. 11/484,085 dated Jun. 10, 2010; 4 pages.
USPTO Notice of Allowance, U.S. Appl. No. 11/601,465, dated Oct. 7, 2011, 19 pages.
USPTO Notice of Allowance, U.S. Appl. No. 11/601,465, dated Nov. 26, 2010, 16 pages.
USPTO Notice of Allowance, U.S. Appl. No. 11/729,818, dated Jan. 26, 2011, 12 pages.
USPTO Notice of Allowance, U.S. Appl. No. 11/729,818, dated May 9, 2011, 8 pages.
USPTO Notice of Allowance, U.S. Appl. No. 11/729,818, dated Jun. 9, 2011, 13 pages.

USPTO Notice of Allowance, U.S. Appl. No. 11/729,818, dated Oct. 5, 2010, 33 pages.
USPTO Notice of Allowance, U.S. Appl. No. 11/729,818, dated Jun. 25, 2010, 7 pages.
USPTO Notice of Allowance, U.S. Appl. No. 11/823,982, dated May 14, 2010, 8 pages.
USPTO Notice of Allowance, U.S. Appl. No. 13/047,620, dated Apr. 11, 2012, 19 pages.
USPTO Requirement for Restriction for U.S. Appl. No. 12/167,100 dated Aug. 20, 2010; 6 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
USPTO Requirement for Restriction for U.S. Appl. No. 12/395,462 dated May 13, 2011; 6 pages.
USPTO Requirement for Restriction/Election for U.S. Appl. No. 11/337,272 dated Sep. 11, 2006; 5 pages.
USPTO Requirement Restriction for U.S. Appl. No. 11/824,249 dated Feb. 17, 2011; 5 pages.
USPTO Restriction Requirement, U.S. Appl. No. 11/601,465, dated Nov. 1, 2007, 5 pages.
USPTO Restriction Requirement, U.S. Appl. No. 13/047,620, dated Feb. 27, 2012, 7 pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. date: Jun. 17, 2003, 10 pages.
Wikipedia, The Free Encyclopedia, "IBM PC Keyboard," <http://en.wikipedia.org/wiki/PC_keyboard> accessed May 19, 2006; 3 pages.
Written Opinion of the International Searching Authority for International Application No. PCT/US08/60696 dated Sep. 22, 2008; 4 pages.
Written Opinion of the International Searching Authority for International Application No. PCT/US2008/013622 mailed Feb. 9, 2009; 5 pages.
USPTO Notice of Allowance for U.S. Appl. No. 11/824,249 dated Mar. 14, 2013; 5 pages.

* cited by examiner

CAPACITANCE TO FREQUENCY CONVERTER

CROSS REFERENCE TO RELATED APPLICATION

This application is a continuation of U.S. application Ser. No. 12/166,228, filed on Jul. 1, 2008, which claims the benefit of U.S. Provisional Application No. 60/947,871, filed on Jul. 3, 2007, both of which are incorporated herein by reference.

TECHNICAL FIELD

This disclosure relates generally to electronic circuits, and in particular but not exclusively, relates to capacitance measurement circuits.

BACKGROUND INFORMATION

Capacitance sensors are used to implement a variety of useful functions including touch sensors (e.g., touch pad, touch dial, touch wheel, etc.), determining the presence of an object, accelerometers, and other functions. In general, capacitive sensors are intended to replace mechanical buttons, knobs, and other similar mechanical user interface controls. A capacitive sensor permits eliminating complicated mechanical switches and buttons, providing reliable operation under harsh conditions. Capacitive sensors are widely used in the modern consumer applications, providing new user interface options in the exiting products (cell phones, digital music players, personal digital assistances, etc.).

One class of capacitive sensor uses a charge transfer technique. Referring to FIG. 1A, the charge transfer technique charges a sensing capacitor Cx in one phase (switch SW1 closed, switch SW2 open) and discharges the sensing capacitor Cx into a summing capacitor Csum in a second phase (SW1 open, SW2 closed). Switches SW1 and SW2 are operated in a non-overlapping manner repeating the transfer of charge from Cx to Csum.

Capacitance sensor 100 is operated to measure the capacitance of Cx in the following manner. In an initial stage, Csum is reset by discharging Csum by temporarily closing switch SW3. Then, switches SW1 and SW2 commence operating in the two non-overlapping phases that charge Cx and transfer the charge from Cx into Csum. The voltage potential on Csum rises with each charge transfer phase, as illustrated in FIG. 1B. The voltage on Csum can by calculated according to equation 1.

$$V_{Csum} = V_{dd}\left(1 - e^{-N\frac{Cx}{Csum}}\right) \quad \text{(Equation 1)}$$

where $V_{Csum}$ represents the voltage on Csum, N represents the cycle count, Cx and Csum represent capacitance values, and Vdd represents a power supply voltage. Accordingly, the capacitance of Cx can be determined by measuring the number of cycles (or time) required to raise Csum to a predetermined voltage potential.

The charge transfer method is advantageous due to its relative low sensitivity to RF fields and RF noise. This relative noise immunity stems from the fact that the sensing capacitor Cx is typically charged by a low-impedance source and the charge is transferred to a low-impedance accumulator (i.e., the summing capacitor Csum). However, conventional capacitance sensors have the disadvantage that that voltage on the summing capacitor Csum rises versus time/cycles in an exponential manner (see FIG. 1B and Equation 1). The exponential relationship between the accumulated voltage potential on Csum and the charge transfer time/cycles requires some linearization if the capacitance of Cx is calculated as a function of the voltage potential on Csum after a predetermined time or number of cycles.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method of operation for a capacitance to frequency converter are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
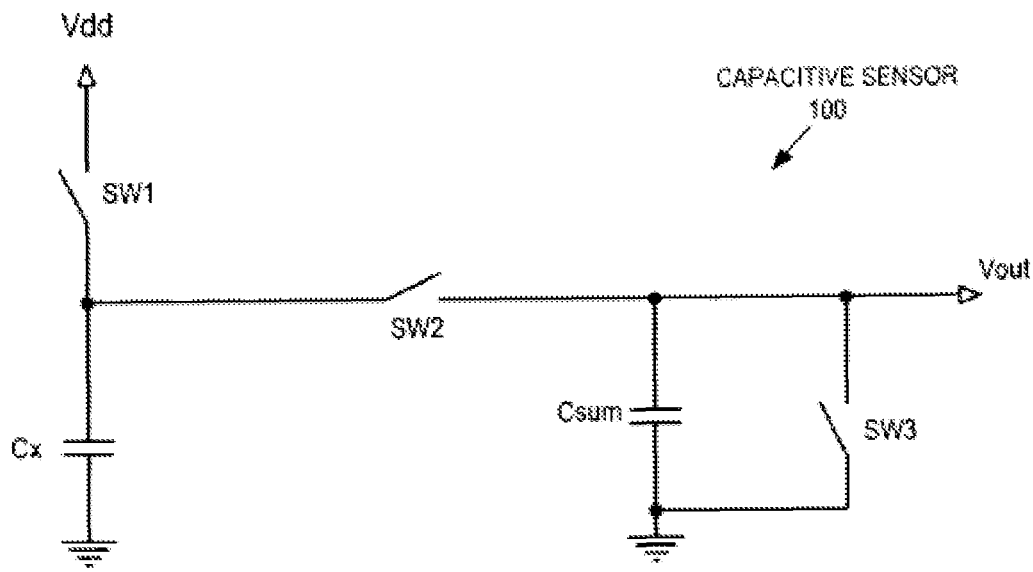
FIG. 1A is a circuit diagram illustrating a conventional capacitance sensor circuit.
Figure 1B:
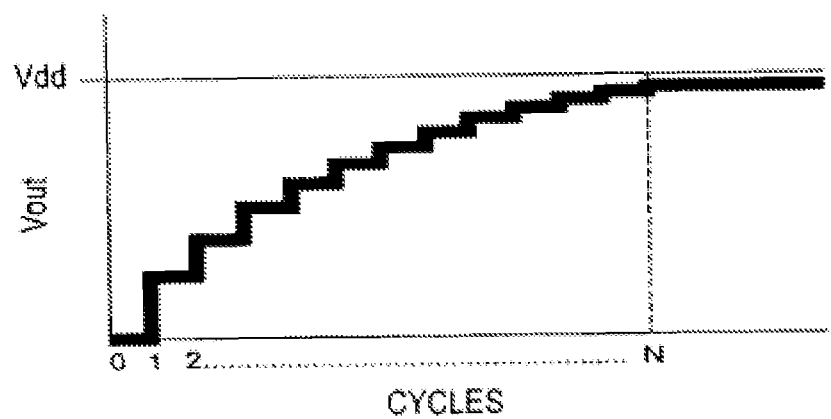
FIG. 1B is a graph illustrating the exponential relationship between voltage on a summing capacitor and charge transfer cycles.
Figure 2:
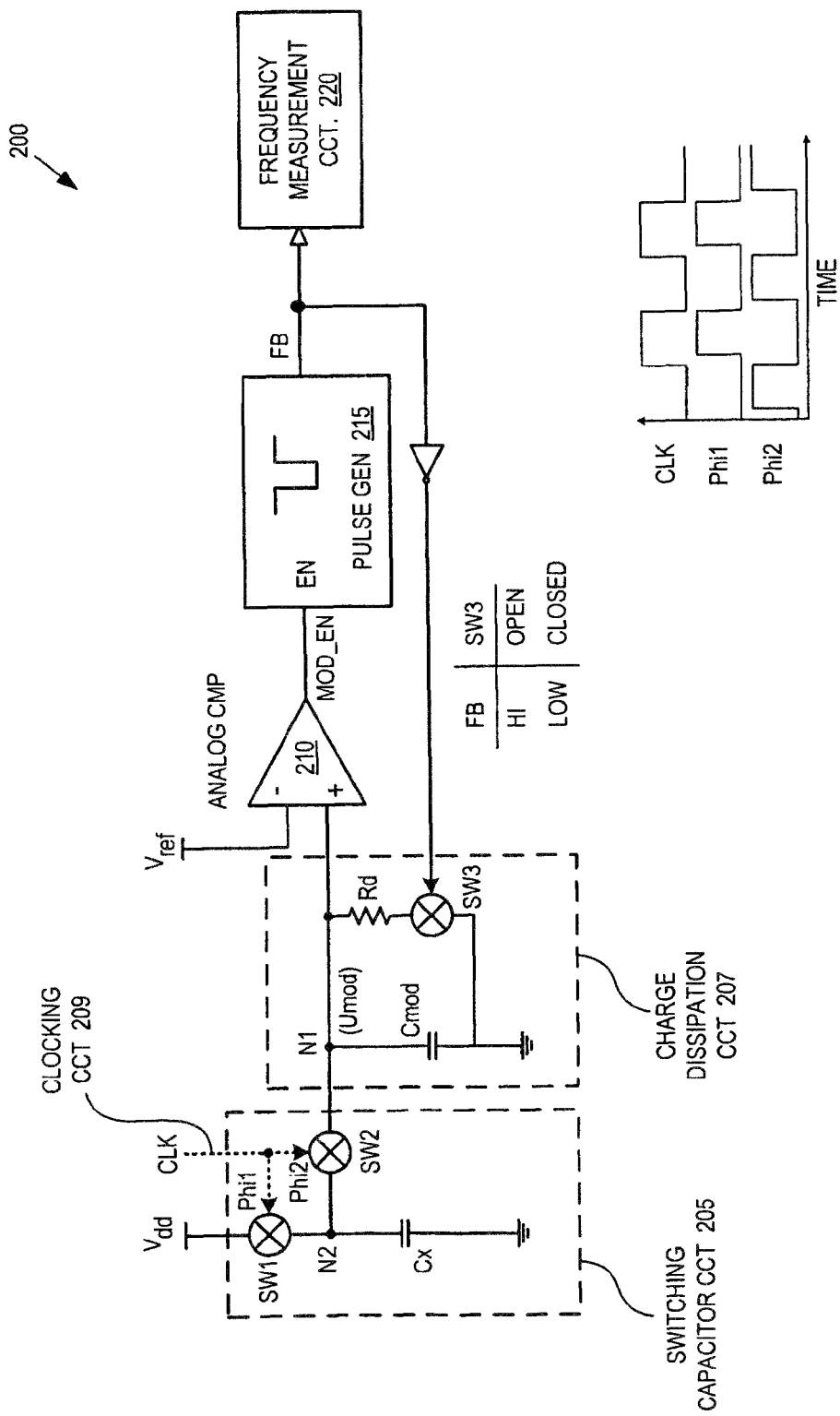
FIG. 2 is a circuit diagram illustrating a capacitance to frequency converter, in accordance with an embodiment of the invention.

FIG. 2 is a circuit diagram illustrating a capacitance to frequency converter 200, in accordance with an embodiment of the invention. Capacitance to frequency converter 200 is capable of converting the measurement of the capacitance of sensing capacitor (Cx) into the measurement of the frequency of a feedback pulse signal (FB). Furthermore, the relationship between the frequency of FB ($f_{FB}$) and the capacitance of Cx is substantially linear. However, it should be appreciated that capacitance to frequency converter 200 may also be used for other functions such as a voltage to frequency converter or current to the frequency converter. Although the system of FIG. 2 is referred to as a capacitance to "frequency" converter, it should be appreciated that the system of FIG. 2 may also be referred to as a capacitance to period converter, since period is merely the reciprocal of frequency.

The illustrated embodiment of capacitance to frequency converter 200 includes a switching capacitor circuit 205, a charge dissipation circuit 207, an analog comparator ("CMP") 210, a pulse generator 215 with enable input, and a frequency measurement circuit 220. The illustrated embodiment of switching capacitor circuit 205 includes sensing capacitor (Cx), a charging switch (SW1), a charge transfer switch (SW2), and a clocking circuit 209. The illustrated embodiment of charge dissipation circuit 207 includes a modulation capacitor (Cmod), a discharge resistor (Rd), and a discharge switch (SW3). While component values of switching capacitor circuit 205 may vary based on the particular application, in general, the capacitance of Cmod will be substantially larger than the capacitance of Cx. Since Cmod acts to accumulate charge transferred from Cx over multiple cycles, it is often referred to as a summing capacitor or an integrating capacitor. Pulse generator 215 generates fixed length pulses synchronized to MOD_EN output from CMP 210. Pulse generator 215 may also be referred to as a sync generator due to the sync waveform it generates.

Figure 3:
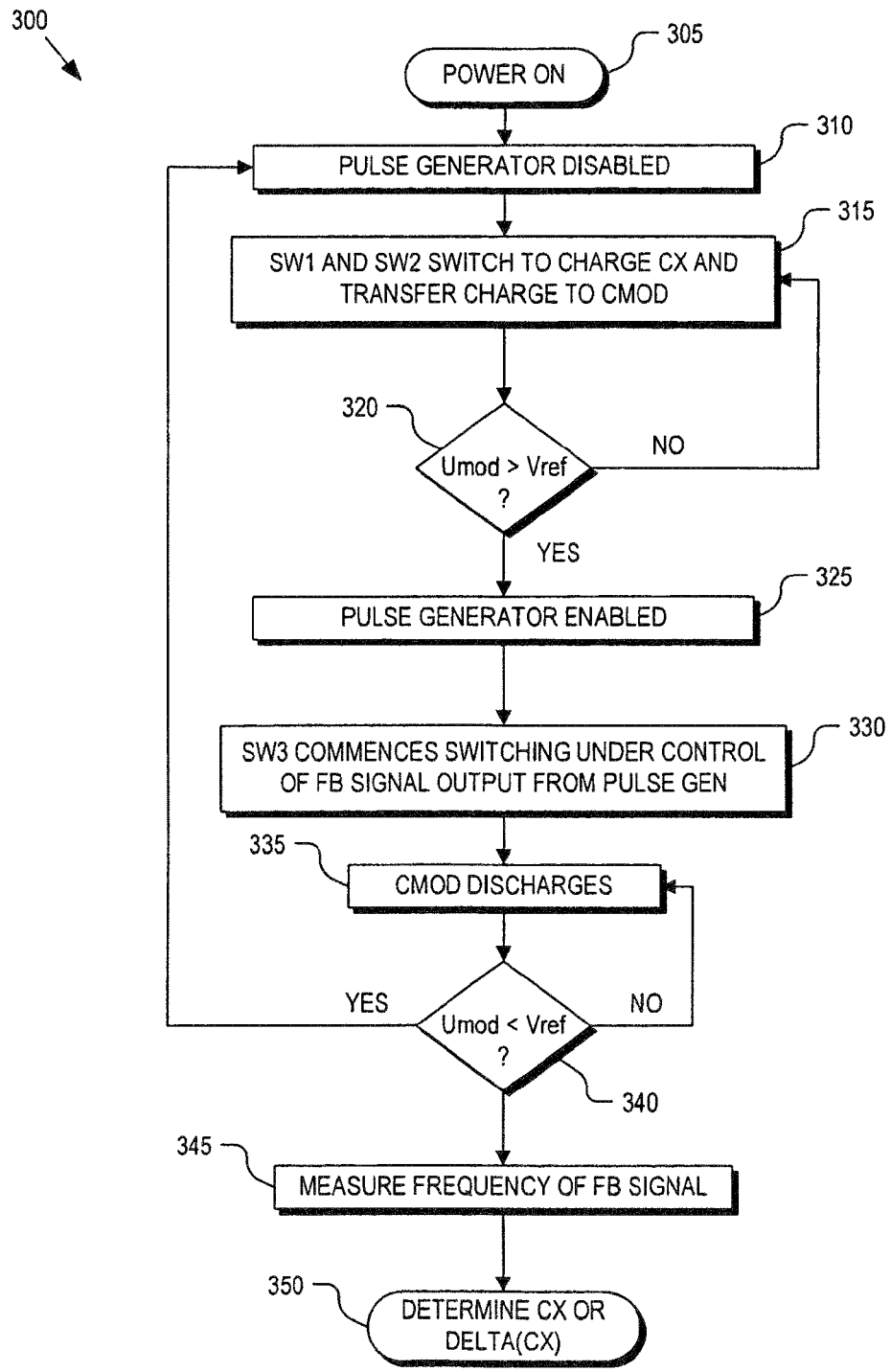
FIG. 3 is a flow chart illustrating a process of operation of a capacitance to frequency converter, in accordance with an embodiment of the invention.

FIG. 3 is a flow chart illustrating a process 300 for operating capacitance to frequency converter 200, in accordance with an embodiment of the invention. The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

In a process block 305, capacitance to frequency converter 200 is powered on and the output of comparator 210 (MOD_EN) is initially low, assuming Cmod is initially discharged and the voltage Umod on the non-inverting input of CMP 210 is less than Vref on its inverting input. In this state, pulse generator 215 is "disabled" generating a constant logic value for the feedback signal FB, which open circuits switch SW3 (process block 310).

Figure 4:
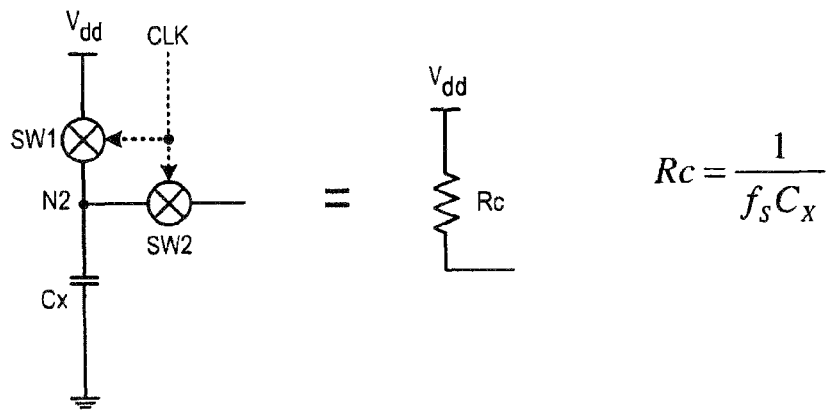
FIG. 4 is a circuit diagram illustrating the equivalent circuit resistance of a switching capacitor circuit, in accordance with an embodiment of the invention.

With power provided to the circuit, switches SW1 and SW2 also commence operation. Switches SW1 and SW2 switch, under control of a clock signal CLK distributed by clocking circuit 209 as two non-overlapping phases Phi1 and Phi2, to reciprocally charge Cx and then transfer the charge from Cx onto Cmod (process block 315). The non-overlapping charge and charge transfer phases may be sufficiently spaced to prevent cross conduction or latch up between SW1 and SW2. During operation, switching capacitor circuit 205 has an equivalent resistance $R_C$ given by equation 2.

$$R_C = \frac{1}{f_{CLK} C_x} \quad \text{(Equation 2)}$$

where $f_{CLK}$ represents the frequency of the clock signal CLK and Cx represents the capacitance of the sensing capacitor Cx. FIG. 4 illustrates the circuit equivalent resistance Rc. The clock signal CLK may be a fixed frequency signal, a spread spectrum clock signal, or otherwise.

As switching capacitor circuit 205 begins charging Cmod, the voltage potential Umod at node N1 begins to rise gradually with each charge transfer through switch SW2. Cmod continues to accumulate charge transferred from Cx until Umod reaches Vref, as determined by CMP 210 (decision block 320). When Umod reaches or passes Vref, CMP 210 toggles its output (MOD_EN) to enable pulse generator 215 (process block 325).

Figure 5:
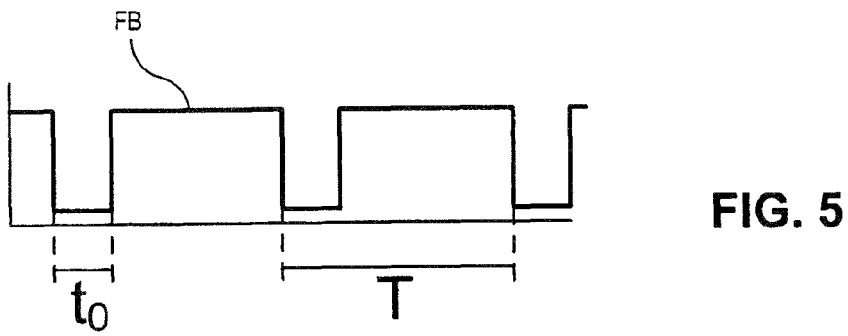
FIG. 5 is a line graph illustrating the output of a pulse generator having a zero level fixed length pulse during an active mode of operation, in accordance with an embodiment of the invention.

The illustrated embodiment of pulse generator 215 produces the FB signal having fixed width negative pulses (e.g., active is logic zero level). However, it should be appreciated that pulse generator 215 may also be implemented as an active high sync generator for generating fixed length positive pulses. With reference to FIG. 5, the duration of the zero level pulses are always fixed at a value $t_0$. Since pulse generator 215 outputs an active low signal, the duty cycle of FB of the illustrated embodiment of pulse generator 215 is defined according to equation 3.

$$\text{Duty Cycle} = \frac{t_0}{T} \quad \text{(Equation 3)}$$

where T is the period of the FB signal and $t_0$ represents the duration of the zero level pulses.

Figure 6:
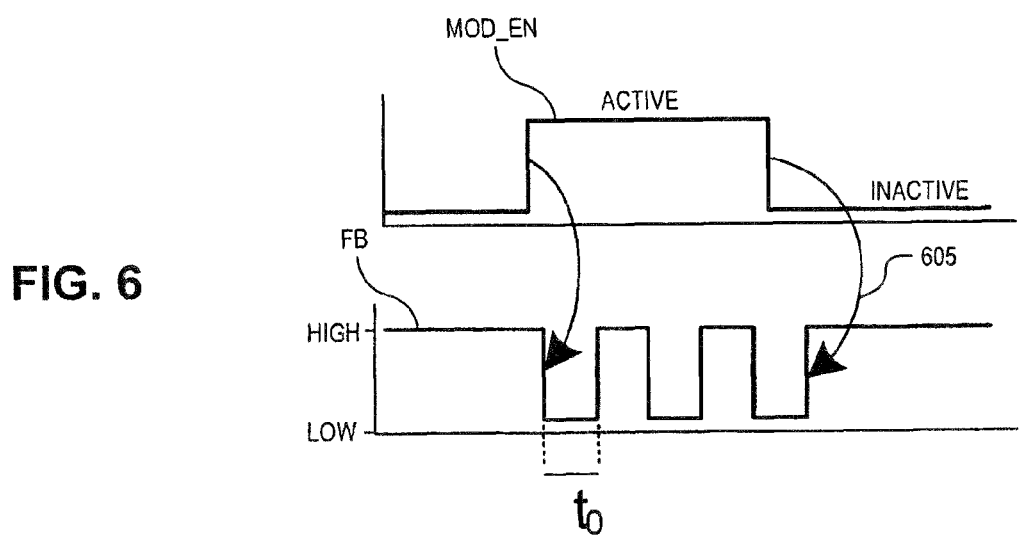
FIG. 6 includes two line graphs illustrating the relationship between a MOD_EN signal generated by a comparator and a feedback pulse signal generated by a pulse generator, in accordance with an embodiment of the invention.

Pulse generator 215 operates in one of three operation modes: 1) when the MOD_EN signal is active constantly, FB is switched with a minimal fixed period having a fixed duty cycle, 2) when the MOD_EN signal is switched from the active state (e.g., ON) to the inactive state (e.g., OFF), FB returns to the inactive high state only after completing the current zero level pulse, and 3) while the MOD_EN signal is in the inactive state (e.g., OFF), FB is output as a static logical high. FIG. 6 illustrates how the active state of the MOD_EN signal generates zero level pulses from pulse generator 215. When the MOD_EN signal transitions from the active state to the inactive state, the current zero level pulse is completed, as illustrated by arrow 605.

As FB continues to toggle while the MOD_EN signal is in the active state, switch SW3 toggles between open and closed states discharges Cmod through discharge resistor Rd (process block 335). Cmod continues to periodically discharge through Rd until Umod drops below Vref (decision block 340). At this point, CMP 210 toggles the MOD_EN signal, deactivating pulse generator 215 (process block 310) and returning FB to the inactive state. With FB returned to the high level inactive state, switch SW3 is open circuited and the charging of Cmod repeats in process block 315.

After an initial transitory startup phase, capacitance to frequency converter 200 enters its steady state phase where the voltage potential Umod on Cmod oscillates or dithers about Vref. This oscillation about Vref creates the modulation signal MOD_EN used to enable/disable pulse generator 215 to thereby modulate the frequency of the feedback pulse signal FB. Once operating in the steady state phase, the frequency of the feedback pulse signal is directly proportional to the capacitance of Cx as seen by equations 4, 5, and 6 below. The current $I_{Cx}$ through the equivalent resistance $R_C$ is $$I_{Cx} = \frac{Vdd - Vref}{Rc} = (Vdd - Vref) \cdot f_{CLK} Cx. \quad \text{(Equation 4)}$$

Since the sum of currents into and out of node N1 must equal zero, the average current $I_{Rd}$ through discharge resistor Rd is $$I_{Rd} = \frac{Vref}{Rd} \cdot \frac{t_0}{T} = \frac{Vref}{Rd} \cdot t_0 F = I_{Cx}, \quad \text{(Equation 5)}$$

where F represents the frequency or 1/T of the FB signal. Finally, by rearranging equation 5 and plugging in equation 4 to eliminate the $I_{Cx}$ variable, $$F = \left(\frac{Vdd}{Vref} - 1\right) \cdot \frac{f_{CLK} R_d}{t_0} \cdot C_x. \quad \text{(Equation 6)}$$

As can be seen from equation 6, at fixed values for Vdd, Vref, Rd, and fclk, the dependence of F on Cx is linear. In short, pulse generator 215 is synchronized to MOD_EN and produces pulses FB with a frequency directly proportional to the capacitance of Cx. Accordingly, in a process block 345, frequency measurement circuit 220 measures the frequency of the feedback pulse signal FB. The measured frequency values can then be used to determine the capacitance Cx or capacitance change ΔCx of the sensing capacitor (process block 350). In one embodiment, frequency measurement circuit 220 may include a simple counter to measure the frequency of the feedback pulse signal FB. For fixed values of Vdd, Rd, and Cx, capacitance to frequency converter 200 operates as a voltage (Vref) to frequency converter where the output frequency of FB is selected by appropriate selection of Vref.

Figure 7A:
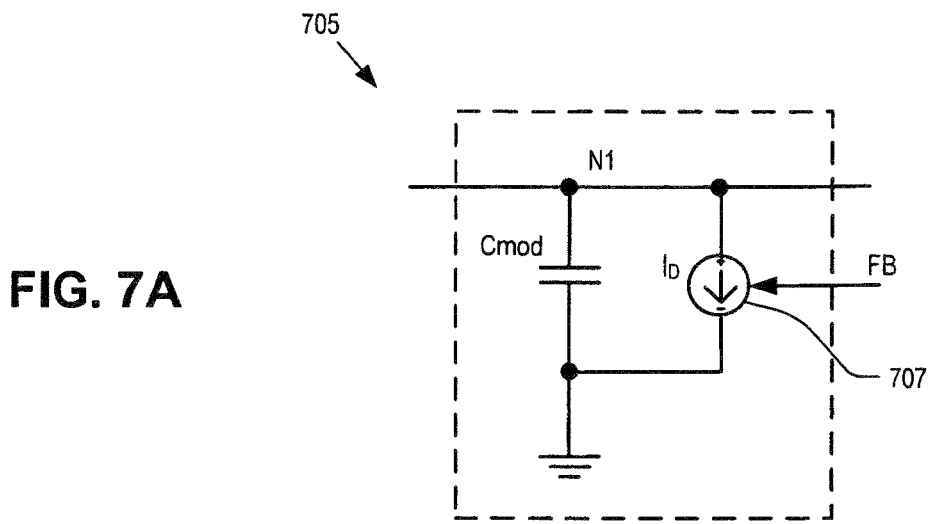
FIGS. 7A-C are circuit diagrams illustrating alternative dissipation circuit implementations, in accordance with embodiments of the invention.
Figure 7B:
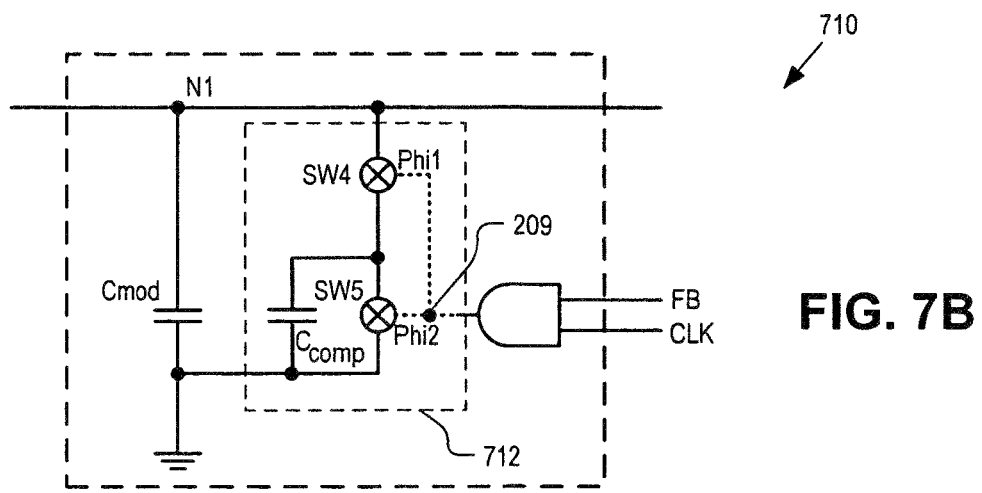
Figure 7C:
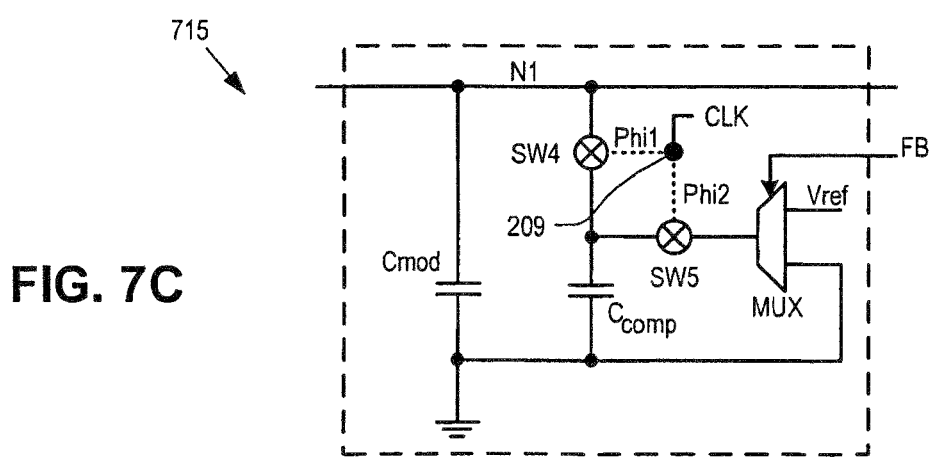

FIGS. 7A-C are circuit diagrams illustrating alternative implementations of charge dissipation circuit 207, in accordance with embodiments of the invention. FIG. 7A illustrates a charge dissipation circuit 705, which replaces SW3 and discharge resistor Rd with a current source 707 controlled by feedback pulse signal FB. When FB is a logic HIGH, current source 707 sinks a current $I_D$ from modulation capacitor Cmod to ground. When FB is logic LOW, current source 707 is disabled.

FIG. 7B illustrates a charge dissipation circuit 710 including a switching capacitor resistor circuit 712 with a gated clock source. When FB is logic HIGH, the clock signal CLK is applied to the switches SW4 and SW5 with non-overlapping pulses (e.g., such as clock signals Phi1 and Phi2), causing a discharging current to flow to ground from modulator capacitor Cmod. At a logic LOW value for FB, the clock signal CLK is gated and switching capacitor circuit 712 does not sink current from modulator capacitor Cmod.

FIG. 7C illustrates a charge dissipation circuit 715 where the non-overlapping clock phases Phi1 and Phi2 are applied constantly to switches SW4 and SW5, but SW4 and SW5 are selectively connected in series between Umod and either Vref or ground by the multiplexor MUX, depending on the value of the feedback pulse signal FB. The principle of operating of charge dissipation circuit 715 is similar to charge dissipation circuit 710 in that SW4, SW5, and Ccomp operate as a switching capacitor resistor circuit.

Figure 8:
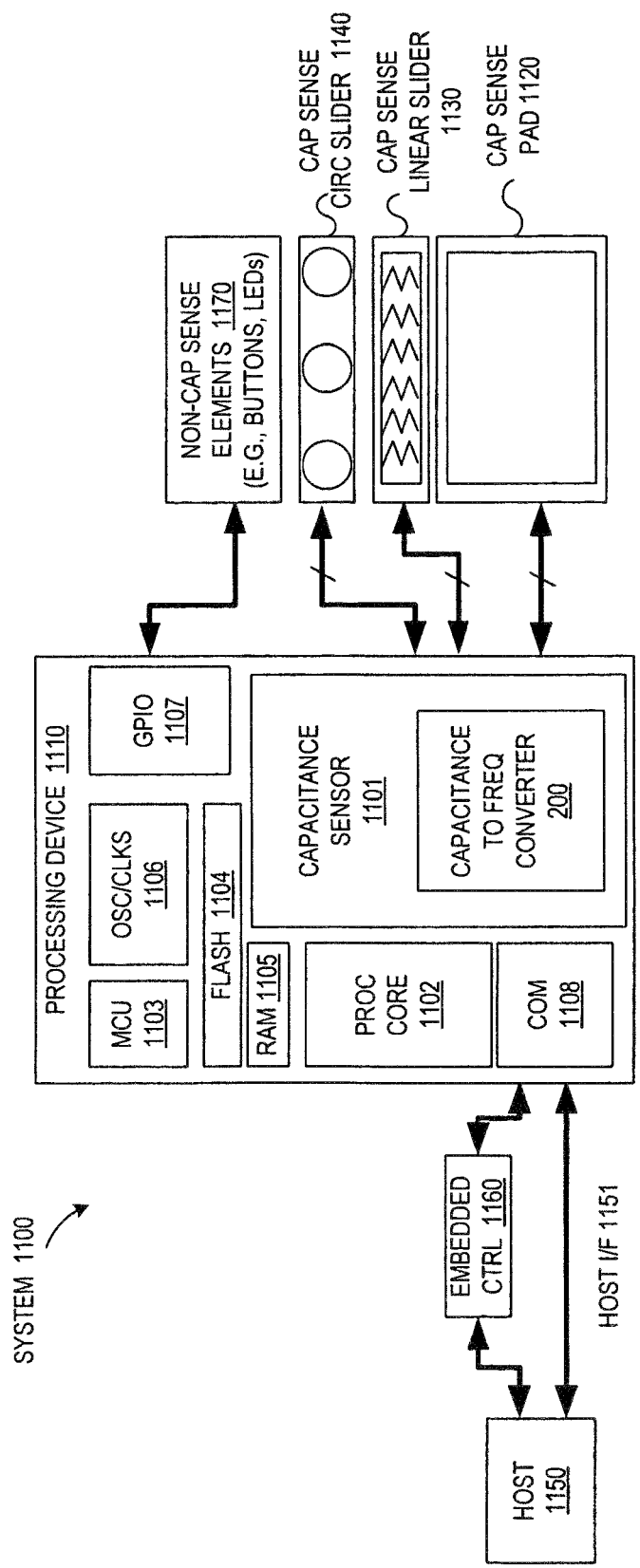
FIG. 8 is a functional block diagram illustrating a demonstrative processing system for implementing a capacitive sense user interface using a capacitance to frequency converter, in accordance with an embodiment of the invention.

FIG. 8 is a functional block diagram illustrating a demonstrative system 1100 for implementing a capacitive sense user interface, in accordance with an embodiment of the invention.

The illustrated embodiment of system 1100 includes a processing device 1110, a capacitive sense pad 1120, a capacitive sense linear slider 1130, a capacitive sense radial slider 1140, a host processor 1150, an embedded controller 1160, and non-capacitance sensor elements 1170. Processing device 1110 may include analog and/or digital general purpose input/output ("GPIO") ports 1107. GPIO ports 1107 may be programmable. GPIO ports 1107 may be coupled to a Programmable Interconnect and Logic ("PIL"), which acts as an interconnect between GPIO ports 1107 and a digital block array of processing device 1110 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 1110 may also include memory, such as random access memory (RAM) 1105 and program flash 1104. RAM 1105 may be static RAM ("SRAM"), and program flash 1104 may be a non-volatile storage, which may be used to store firmware. Processing device 1110 may also include a memory controller unit ("MCU") 1103 coupled to memory and the processing core 1102.

Processing device 1110 may also include an analog block array (not illustrated). The analog block array is also coupled to the system bus. The analog block array also may be configured to implement a variety of analog circuits (e.g., ADC, analog filters, etc.) using, in one embodiment, configurable UMs. The analog block array may also be coupled to the GPIO 1107.

As illustrated, capacitance sensor 1101, which includes an implementation of capacitance to frequency converter 200 may be integrated into processing device 1110. Capacitance sensor 1101 may include analog I/O for coupling to an external component, such as capacitive sense pad 1120, capacitive sense linear slider 1130, capacitive sense radial slider 1140, and/or other capacitive sense devices. Capacitive sense pad 1120, capacitive sense linear slider 1130, and/or capacitive sense radial slider 1140 may each include one or more sensing capacitors Cx to implement the individual capacitive sense buttons therein.

Processing device 1110 may include internal oscillator/clocks 1106 and communication block 1108. The oscillator/clocks block 1106 provides clock signals to one or more of the components of processing device 1110. Communication block 1108 may be used to communicate with an external component, such as a host processor 1150, via host interface (I/F) line 1151. Alternatively, processing device 1110 may also be coupled to embedded controller 1160 to communicate with the external components, such as host 1150. Interfacing to the host 1150 can be through various methods. In one exemplary embodiment, interfacing with the host 1150 may be done using a standard PS/2 interface to connect to embedded controller 1160, which in turn sends data to the host 1150 via low pin count (LPC) interface. In some instances, it may be beneficial for processing device 1110 to do both touch-sensor pad and keyboard control operations, thereby freeing up the embedded controller 1160 for other housekeeping functions. In another exemplary embodiment, interfacing may be done using a universal serial bus (USB) interface directly coupled to host 1150 via host interface line 1151. Alternatively, processing device 1110 may communicate to external components, such as host 1150 using industry standard interfaces, such as USB, PS/2, inter-integrated circuit (I2C) bus, or system packet interfaces (SPI). Host 1150 and/or embedded controller 1160 may be coupled to processing device 1110 with a ribbon or flex cable from an assembly, which houses the sensing device and processing device.

In one embodiment, processing device 1110 is configured to communicate with embedded controller 1160 or host 1150 to send and/or receive data. The data may be a command or alternatively a signal. In an exemplary embodiment, system 1100 may operate in both standard-mouse compatible and enhanced modes. The standard-mouse compatible mode utilizes the HID class drivers already built into the Operating System (OS) software of host 1150. These drivers enable processing device 1110 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, processing device 1110 may be configured to communicate with embedded controller 1160 or host 1150, using non-OS drivers, such as dedicated touch-sensor pad drivers, or other drivers known by those of ordinary skill in the art.

Processing device 1110 may reside on a common carrier substrate such as, for example, an integrated circuit (IC) die substrate, a multi-chip module substrate, or the like. Alternatively, the components of processing device 1110 may be one or more separate integrated circuits and/or discrete components. In one exemplary embodiment, processing device 1110 may be a Programmable System on a Chip (PSoC™) processing device, manufactured by Cypress Semiconductor Corporation, San Jose, Calif. Alternatively, processing device 1110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like. In an alternative embodiment, for example, processing device 1110 may be a network processor having multiple processors including a core unit and multiple microengines. Additionally, processing device 1110 may include any combination of general-purpose processing device(s) and special-purpose processing device(s).

Capacitance sensor 1101 may be integrated into the IC of processing device 1110, or alternatively, in a separate IC. Descriptions of capacitance sensor 1101 may be generated and compiled for incorporation into other integrated circuits. For example, behavioral level code describing capacitance sensor 1101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 1101.

In one embodiment, electronic system 1100 may be used in a notebook computer. Alternatively, system 1100 may be used in other applications, such as a mobile handset, a personal data assistant (PDA), a keyboard, a television, a remote control, a monitor, a handheld multi-media device, a handheld video player, a handheld gaming device, or a control panel.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible medium includes any mechanism that provides (e.g., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of converting a capacitance value to a frequency value, the method comprising:
   reciprocally transferring charge between a first capacitor having the capacitance value and a second capacitor;
   selectively modulating a frequency of a generated signal in response to the charge transferred between the first capacitor and the second capacitor; and
   selectively transferring the charge relative to the second capacitor in response to the generated signal.

2. The method of claim 1, wherein selectively modulating the frequency of the generated signal comprises:
   comparing a voltage potential on the second capacitor to a reference voltage potential;
   generating a modulation signal dependent upon whether the voltage potential is greater or less than the reference voltage; and
   modulating the frequency of the generated signal based on the modulation signal.

3. The method of claim 2, wherein modulating the frequency of the generated signal comprises modulating a period between fixed pulse lengths.

4. The method of claim 3, wherein modulating the frequency of the generated signal further comprises:
   selectively enabling a pulse generator in response to the modulation signal;
   generating the generated signal with a minimal fixed period when the modulation signal is in a first state; and
   generating the generated signal having a fixed logic level between the fixed length pulses while the modulation signal is in a second state.

5. The method of claim 4, wherein modulating the period between the fixed length pulses comprises completing generation of a current one of the fixed length pulses prior to reverting to the fixed logic after the modulation signal transitions to the second state.

6. The method of claim 1, wherein reciprocally transferring charge between the first capacitor having the capacitance value and the second capacitor comprises two non-overlapping switching phases.

7. A capacitance to frequency converter comprising:
a switching capacitor circuit to transfer charge between a first capacitor having the capacitance and a second capacitor;
a modulator coupled to the switching capacitor to selectively modulate a frequency of a generated signal in response to the charge transferred between the first capacitor and the second capacitor; and
a charge dissipation circuit coupled to the modulator to selectively transfer the charge relative to the second capacitor in response to the generated signal.

8. The capacitance to frequency converter of claim 7, wherein selectively modulating the frequency of the generated signal comprises:
comparing a voltage potential on the second capacitor to a reference voltage potential;
generating a modulation signal dependent upon whether the voltage potential is greater or less than the reference voltage; and
modulating the frequency of the generated signal based on the modulation signal.

9. The capacitance to frequency converter of claim 8, wherein modulating the frequency of the generated signal comprises modulating a period between fixed puke lengths.

10. The capacitance to frequency converter of claim 9, wherein modulating the frequency of the generated signal further comprises:
selectively enabling a pulse generator in response to the modulation signal;
generating the generated signal with a minimal fixed period when the modulation signal is in a first state; and
generating the generated signal having a fixed logic level between the fixed length pulses while the modulation signal is in a second state.

11. The capacitance to frequency converter of claim 10, wherein modulating the period between the fixed length pulses comprises completing generation of a current one of the fixed length pulses prior to reverting to the fixed logic level after the modulation signal transitions to the second state.

12. The capacitance to frequency converter of claim 7, wherein reciprocally transferring charge between the first capacitor having the capacitance value and the second capacitor comprises two non-overlapping switching phases.

13. An apparatus comprising:
a switching capacitor circuit to transfer charge between a first capacitor having the capacitance and a second capacitor;
a comparator coupled to the second capacitor to compare a potential on the second capacitor to a first voltage and to generate a modulation signal;
a pulse generator coupled to the comparator to receive the modulation signal and to generate a feedback signal responsive to the modulation signal; and
a charge dissipation circuit coupled to the pulse generator to selectively transfer the charge relative to the second capacitor in response to the feedback signal.

14. The apparatus of claim 13, wherein the pulse generator generates a zero level fixed length pulse having a period between adjacent fixed length pulses modulated by the output of the comparator.

15. The apparatus of claim 14, further comprising a frequency measurement circuit coupled to the pulse generator to measure a frequency of the feedback signal.

16. The apparatus of claim 13, wherein the charge dissipation circuit comprises:
the second capacitor;
a resistor; and
a switch coupled in series with the resistor to selectively transfer the charge relative to the second capacitor in response to the feedback signal.

17. The apparatus of claim 16, wherein the switching capacitor circuit comprises:
a second switch to the first capacitor to selectively transfer charge relative to the first capacitor; and
a third switch coupled between the first capacitor and the second capacitor to selectively transfer the charge between the first capacitor and the second capacitor.

18. The apparatus of claim 13, wherein the comparator comprises an analog comparator.

19. The apparatus of claim 13, wherein an enable input of the pulse generator is coupled to the comparator to receive the modulation signal.

20. The apparatus of claim 13, further comprising a clocking circuit coupled to operate the second switch and the third switch in two non-overlapping phases.

* * * * *